United States Patent
Wada et al.

(10) Patent No.: US 10,192,960 B2
(45) Date of Patent: Jan. 29, 2019

(54) SILICON CARBIDE SEMICONDUCTOR DEVICE AND METHOD FOR MANUFACTURING SAME

(71) Applicant: Sumitomo Electric Industries, Ltd., Osaka-shi (JP)

(72) Inventors: Keiji Wada, Osaka (JP); Takeyoshi Masuda, Osaka (JP); Hideto Tamaso, Osaka (JP); Yu Saitoh, Osaka (JP); Toru Hiyoshi, Osaka (JP); Mitsuhiko Sakai, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 62 days.

(21) Appl. No.: 14/906,482

(22) PCT Filed: Jun. 10, 2014

(86) PCT No.: PCT/JP2014/065312
§ 371 (c)(1),
(2) Date: Jan. 20, 2016

(87) PCT Pub. No.: WO2015/012009
PCT Pub. Date: Jan. 29, 2015

(65) Prior Publication Data
US 2016/0181372 A1     Jun. 23, 2016

(30) Foreign Application Priority Data
Jul. 26, 2013 (JP) .................................. 2013-155671

(51) Int. Cl.
*H01L 29/15*     (2006.01)
*H01L 29/16*     (2006.01)
(Continued)

(52) U.S. Cl.
CPC ...... *H01L 29/1608* (2013.01); *H01L 21/0475* (2013.01); *H01L 21/0485* (2013.01);
(Continued)

(58) Field of Classification Search
CPC ............. H01L 21/0475; H01L 21/0485; H01L 29/0696; H01L 29/1095; H01L 29/1608;
(Continued)

(56) References Cited

U.S. PATENT DOCUMENTS 4,982,260 A * 1/1991 Chang ................... H01L 29/861
257/476
5,424,231 A * 6/1995 Yang .................... H01L 29/0878
148/DIG. 126
(Continued)

FOREIGN PATENT DOCUMENTS

| JP | 2000-509559 | 7/2000 |
|---|---|---|
| JP | 2001-267570 A | 9/2001 |

(Continued)

OTHER PUBLICATIONS

International Search Report in International PCT Application No. JP2014/065312, dated Aug. 12, 2014.
(Continued)

*Primary Examiner* — Jay C Kim
(74) *Attorney, Agent, or Firm* — Venable LLP; Michael A. Sartori; Tamatane J. Aga

(57) ABSTRACT

A silicon carbide layer includes a drift region, a body region and a source region. The drift region constitutes a first main surface and has a first conductivity type. The body region is provided on the drift region, and has a second conductivity type. It is provided on the body region to be separated from the drift region, constitutes a second main surface, and has the first conductivity type. The silicon carbide layer is provided with a trench including a first side wall portion and
(Continued)

a first bottom portion. The silicon carbide layer is embedded in the drift region to face the first bottom portion, and includes a second conductivity type region having the second conductivity type. The second conductivity type region is electrically connected to the source region.

16 Claims, 20 Drawing Sheets

(51) Int. Cl.
  *H01L 29/78*  (2006.01)
  *H01L 29/66*  (2006.01)
  *H01L 29/06*  (2006.01)
  *H01L 21/04*  (2006.01)
  *H01L 29/08*  (2006.01)
  *H01L 29/10*  (2006.01)
  *H01L 29/739*  (2006.01)

(52) U.S. Cl.
  CPC ...... *H01L 29/0615* (2013.01); *H01L 29/0619* (2013.01); *H01L 29/0623* (2013.01); *H01L 29/0696* (2013.01); *H01L 29/0865* (2013.01); *H01L 29/1095* (2013.01); *H01L 29/66068* (2013.01); *H01L 29/7397* (2013.01); *H01L 29/7811* (2013.01); *H01L 29/7813* (2013.01); *H01L 29/0638* (2013.01)

(58) Field of Classification Search
  CPC ............. H01L 29/7397; H01L 29/7813; H01L 29/7818
  USPC .......................................................... 257/77
  See application file for complete search history.

(56) References Cited

U.S. PATENT DOCUMENTS

| | | | | |
|---|---|---|---|---|
| 5,895,951 A * | 4/1999 | So | H01L 29/7813 | 257/329 |
| 6,037,632 A * | 3/2000 | Omura | H01L 21/74 | 257/139 |
| 6,040,600 A * | 3/2000 | Uenishi | H01L 21/26546 | 257/330 |
| 6,049,108 A * | 4/2000 | Williams | H01L 27/0255 | 257/155 |
| 6,091,108 A * | 7/2000 | Harris | H01L 29/0623 | 257/135 |
| 6,259,134 B1 * | 7/2001 | Amaratunga | H01L 27/0716 | 257/135 |
| 6,342,709 B1 * | 1/2002 | Sugawara | H01L 29/0619 | 257/138 |
| 6,455,378 B1 * | 9/2002 | Inagawa | H01L 29/7808 | 257/E29.121 |
| 6,621,107 B2 * | 9/2003 | Blanchard | H01L 29/7806 | 257/155 |
| 6,621,132 B2 * | 9/2003 | Onishi | H01L 29/0634 | 257/330 |
| 6,627,499 B2 * | 9/2003 | Osawa | H01L 29/0634 | 257/330 |
| 6,750,508 B2 * | 6/2004 | Omura | H01L 29/8725 | 257/329 |
| 6,762,455 B2 * | 7/2004 | Oppermann | H01L 29/0634 | 257/335 |
| 6,825,537 B2 * | 11/2004 | Iwamoto | H01L 29/0634 | 257/329 |
| 6,836,001 B2 * | 12/2004 | Yamauchi | H01L 29/0634 | 257/330 |
| 6,838,730 B1 * | 1/2005 | Kawaguchi | H01L 29/7813 | 257/329 |
| 6,855,970 B2 * | 2/2005 | Hatakeyama | H01L 29/0615 | 257/164 |
| 6,930,352 B2 * | 8/2005 | Saito | H01L 29/0634 | 257/133 |
| 6,969,887 B2 * | 11/2005 | Mizukami | H01L 29/0623 | 257/330 |
| 7,038,260 B1 * | 5/2006 | Yu | H01L 29/66848 | 257/287 |
| 7,279,743 B2 * | 10/2007 | Pattanayak | H01L 29/7813 | 257/135 |
| 7,307,312 B2 * | 12/2007 | Suzuki | H01L 21/78 | 257/328 |
| 7,332,770 B2 * | 2/2008 | Kobayashi | H01L 29/0634 | 257/328 |
| 7,335,949 B2 * | 2/2008 | Ninomiya | H01L 29/0634 | 257/328 |
| 7,342,265 B2 * | 3/2008 | Kuwahara | G06F 17/5068 | 257/288 |
| 7,345,339 B2 * | 3/2008 | Yamaguchi | H01L 29/0634 | 257/331 |
| 7,372,100 B2 * | 5/2008 | Saito | H01L 29/0634 | 257/329 |
| 7,411,266 B2 * | 8/2008 | Tu | H01L 29/0634 | 257/492 |
| 7,485,921 B2 * | 2/2009 | Kawaguchi | H01L 29/0634 | 257/129 |
| 7,489,011 B2 * | 2/2009 | Yilmaz | H01L 29/0619 | 257/135 |
| 7,642,597 B2 * | 1/2010 | Saito | H01L 29/0634 | 257/287 |
| 7,663,181 B2 * | 2/2010 | Ohyanagi | H01L 29/7722 | 257/328 |
| 7,679,146 B2 * | 3/2010 | Tu | H01L 29/0634 | 257/401 |
| 7,745,878 B2 * | 6/2010 | Bhalla | H01L 29/407 | 257/330 |
| 7,768,066 B2 * | 8/2010 | Onose | H01L 25/18 | 257/329 |
| 7,825,449 B2 * | 11/2010 | Suzuki | H01L 29/0619 | 257/301 |
| 7,910,440 B2 * | 3/2011 | Ohta | H01L 29/66727 | 257/330 |
| 7,910,486 B2 * | 3/2011 | Yilmaz | B82Y 10/00 | 257/E21.042 |
| 8,022,414 B2 * | 9/2011 | Suzuki | H01L 29/0623 | 257/262 |
| 8,049,270 B2 * | 11/2011 | Akiyama | H01L 29/0623 | 257/328 |
| 8,058,686 B2 * | 11/2011 | Yamanobe | H01L 29/0619 | 257/330 |
| 8,067,798 B2 * | 11/2011 | Hino | H01L 29/41766 | 257/330 |
| 8,076,719 B2 * | 12/2011 | Zeng | H01L 29/0634 | 257/330 |
| 8,093,653 B2 * | 1/2012 | Tu | H01L 29/1095 | 257/330 |
| 8,097,917 B2 * | 1/2012 | Kumar | H01L 29/66666 | 257/330 |
| 8,188,484 B2 * | 5/2012 | Nakano | H01L 29/45 | 257/330 |
| 8,188,538 B2 * | 5/2012 | Nakano | H01L 29/1608 | 257/330 |
| 8,193,564 B2 * | 6/2012 | Suzuki | H01L 29/0623 | 257/216 |
| 8,203,181 B2 * | 6/2012 | Hirler | H01L 29/0834 | 257/331 |
| 8,283,721 B2 * | 10/2012 | Nakano | H01L 29/0623 | 257/330 |
| 8,362,551 B2 * | 1/2013 | Hirler | H01L 29/407 | 257/330 |
| 8,384,153 B2 * | 2/2013 | Yamamoto | H01L 29/0634 | 257/330 |
| 8,421,148 B2 * | 4/2013 | Harris | H01L 29/0623 | 257/302 |
| 8,431,991 B2 * | 4/2013 | Iwamuro | H01L 29/0661 | 257/341 |
| 8,575,685 B2 * | 11/2013 | Bobde | H01L 29/407 | 257/328 |

(56) References Cited

U.S. PATENT DOCUMENTS

| | | | | |
|---|---|---|---|---|
| 8,581,341 B2* | 11/2013 | Darwish | | H01L 29/407 257/330 |
| 8,604,540 B2* | 12/2013 | Malhan | | H01L 29/8128 257/329 |
| 8,618,555 B2* | 12/2013 | Suzuki | | H01L 29/1095 257/77 |
| 8,637,922 B1* | 1/2014 | Siemieniec | | H01L 21/049 257/328 |
| 8,680,613 B2* | 3/2014 | Guan | | H01L 29/407 257/330 |
| 8,704,295 B1* | 4/2014 | Darwish | | H01L 29/7806 257/330 |
| 8,803,251 B2* | 8/2014 | Lee | | H01L 29/407 257/168 |
| 8,987,812 B2* | 3/2015 | Kono | | H01L 21/0465 257/328 |
| 9,048,214 B2* | 6/2015 | Padmanabhan | | H01L 29/404 |
| 9,136,322 B2* | 9/2015 | Nakano | | H01L 29/0623 |
| 9,184,286 B2* | 11/2015 | Nakano | | H01L 21/8213 |
| 9,219,149 B2* | 12/2015 | Mauder | | H01L 29/7827 |
| 9,368,616 B2* | 6/2016 | Nakano | | H01L 29/41766 |
| 9,419,092 B2* | 8/2016 | Carta | | H01L 29/0619 |
| 9,508,596 B2* | 11/2016 | Tipirneni | | H01L 21/8234 |
| 9,761,696 B2* | 9/2017 | Li | | H01L 29/1095 |
| 9,947,770 B2* | 4/2018 | Li | | H01L 29/66734 |
| 2001/0038108 A1 | 11/2001 | Kitabatake et al. | | |
| 2005/0077572 A1* | 4/2005 | Yamauchi | | H01L 29/0619 257/341 |
| 2007/0013000 A1* | 1/2007 | Shiraishi | | H01L 29/0634 257/341 |
| 2008/0116512 A1* | 5/2008 | Kawaguchi | | H01L 29/0634 257/334 |
| 2009/0166730 A1 | 7/2009 | Okuno et al. | | |
| 2012/0261746 A1* | 10/2012 | Darwish | | H01L 29/1095 257/330 |
| 2012/0326166 A1 | 12/2012 | Masuda et al. | | |
| 2013/0099251 A1 | 4/2013 | Hiyoshi et al. | | |
| 2013/0306983 A1* | 11/2013 | Nakano | | H01L 29/0623 257/76 |
| 2013/0313576 A1* | 11/2013 | Nakano | | H01L 29/8611 257/77 |
| 2014/0103364 A1* | 4/2014 | Nakano | | H01L 29/435 257/77 |
| 2014/0169045 A1 | 6/2014 | Ueno | | |
| 2014/0175459 A1* | 6/2014 | Yamamoto | | H01L 29/1095 257/77 |
| 2014/0264433 A1* | 9/2014 | Hu | | H01L 29/7395 257/139 |
| 2015/0129893 A1* | 5/2015 | Nakano | | H01L 29/41766 257/77 |

FOREIGN PATENT DOCUMENTS

| | | | | |
|---|---|---|---|---|
| JP | 2001-352065 A | | 12/2001 | |
| JP | 2009-158681 A | | 7/2009 | |
| JP | WO 2010/116575 | * | 10/2010 | H01L 29/78 |
| JP | WO 2012/105611 | * | 8/2012 | H01L 29/47 |
| JP | WO 2012/105613 | * | 8/2012 | H01L 29/78 |
| JP | 2012-169385 A | | 9/2012 | |
| JP | 2013-008890 A | | 1/2013 | |
| JP | 2013-089836 A | | 5/2013 | |
| JP | WO 2013/081089 | * | 6/2013 | H01L 29/78 |
| WO | WO-97/47045 A1 | | 12/1997 | |
| WO | WO-2012/108165 A1 | | 8/2012 | |
| WO | 2013/031212 A1 | | 3/2013 | |

OTHER PUBLICATIONS

Notice of Grounds of Rejection in counterpart Japanese Patent Application No. 2013-155671, dated Nov. 1, 2016.

* cited by examiner

SILICON CARBIDE SEMICONDUCTOR DEVICE AND METHOD FOR MANUFACTURING SAME

TECHNICAL FIELD

The present invention relates to a silicon carbide semiconductor device and a method for manufacturing the silicon carbide semiconductor device, in particular, a silicon carbide semiconductor device provided with a trench and a method for manufacturing the silicon carbide semiconductor device.

BACKGROUND ART

In recent years, in order to achieve high breakdown voltage, low loss, and utilization of semiconductor devices, such as a MOSFET (Metal Oxide Semiconductor Field Effect Transistor), under a high temperature environment, silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on resistance, and the like. Further, the semiconductor device thus adopting silicon carbide as its material has characteristics less deteriorated even under a high temperature environment than those of a semiconductor device adopting silicon as its material, advantageously.

Japanese National Patent Publication No. 2000-509559 (Patent Document 1) describes a silicon carbide field effect transistor having a gate trench. The silicon carbide field effect transistor includes: a p region provided near the bottom portion of a gate trench; and a source contact in contact with the p region.

CITATION LIST

Patent Document

PTD 1: Japanese National Patent Publication No. 2000-509559

SUMMARY OF INVENTION

Technical Problem

However, according to the silicon carbide field effect transistor described in Japanese National Patent Publication No. 2000-509559, it is difficult to sufficiently relax electric field concentration at a corner portion of the gate trench.

The present invention has been made to solve the problem described above, and has an object to provide a silicon carbide semiconductor device in which electric field concentration at a corner portion of a trench can be effectively relaxed, as well as a method for manufacturing such a silicon carbide semiconductor device.

Solution to Problem

A silicon carbide semiconductor device according to the present invention includes a silicon carbide layer. The silicon carbide layer has a first main surface and a second main surface opposite to the first main surface. The silicon carbide layer includes a drift region, a body region, and a source region. The drift region constitutes the first main surface and has a first conductivity type. The body region is provided on the drift region and has a second conductivity type different from the first conductivity type. The source region is provided on the body region to be separated from the drift region, constitutes the second main surface, and has the first conductivity type. The silicon carbide layer is provided with a trench including a first side wall portion and a first bottom portion, the first side wall portion extending from the second main surface to the drift region through the source region and the body region, the first bottom portion being in the drift region. The silicon carbide layer includes a second conductivity type region that is embedded in the drift region to face the first bottom portion and that has the second conductivity type. The second conductivity type region is electrically connected to the source region.

A method for manufacturing a silicon carbide semiconductor device according to the present invention includes the following steps. There is prepared a silicon carbide layer having a first main surface and a second main surface opposite to the first main surface. A trench is formed in the second main surface of the silicon carbide layer. The silicon carbide layer includes a drift region, a body region, and a source region. The drift region constitutes the first main surface and has a first conductivity type. The body region is provided on the drift region and has a second conductivity type different from the first conductivity type. The source region is provided on the body region to be separated from the drift region, constitutes the second main surface, and has the first conductivity type. The trench includes a first side wall portion and a first bottom portion, the first side wall portion extending from the second main surface to the drift region through the source region and the body region, the first bottom portion being in the drift region. The silicon carbide layer includes a second conductivity type region that is embedded in the drift region to face the first bottom portion and that has the second conductivity type. The second conductivity type region is electrically connected to the source region.

Advantageous Effects of Invention

According to the present invention, there are provided a silicon carbide semiconductor device in which electric field concentration at a corner portion of a trench can be effectively relaxed, as well as a method for manufacturing such a silicon carbide semiconductor device.

DESCRIPTION OF EMBODIMENTS

Figure 1:
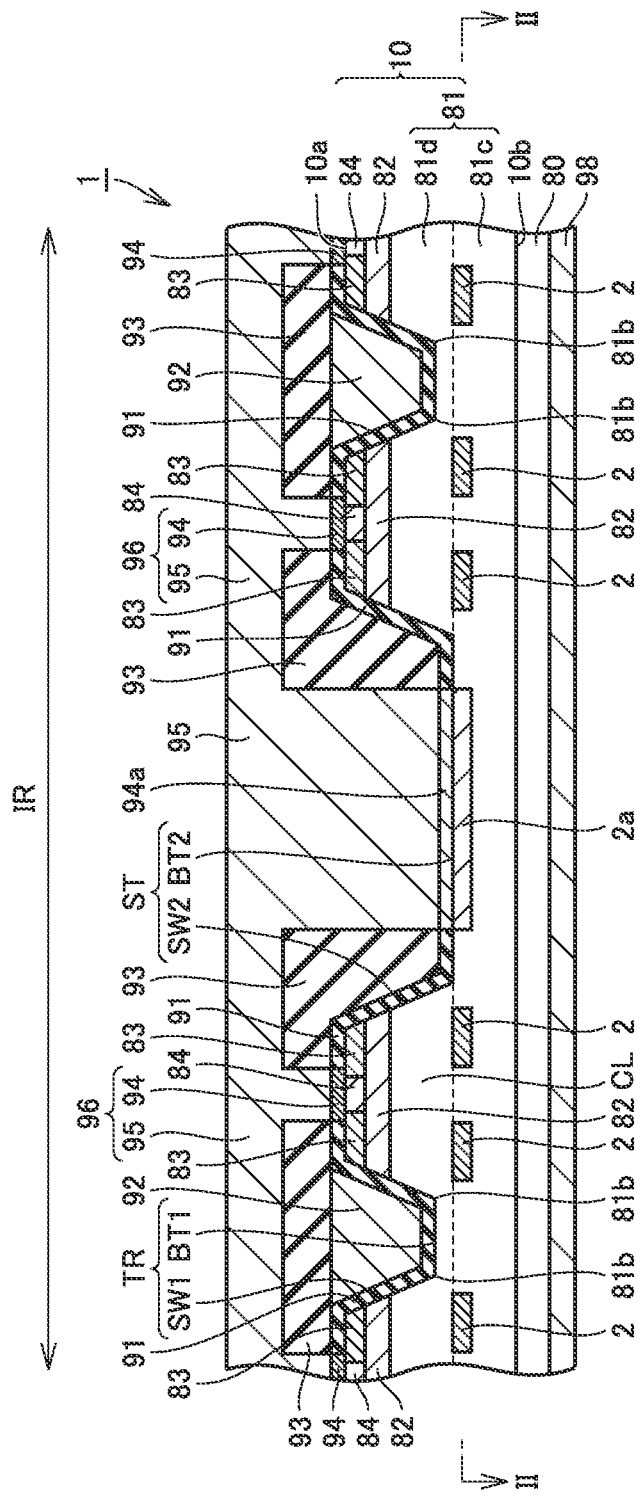
FIG. 1 is a schematic cross sectional view showing a configuration of a silicon carbide semiconductor device according to a first embodiment of the present invention.

Description of Embodiments of the Invention of the Present Application

The following describes embodiments of the present invention based on figures. It should be noted that in the below-described figures, the same or corresponding portions are given the same reference characters and are not described repeatedly. Regarding crystallographic indications in the present specification, an individual orientation is represented by [ ], a group orientation is represented by < >, and an individual plane is represented by ( ) and a group plane is represented by { }. In addition, a negative crystallographic index is normally expressed by putting "−" (bar) above a numeral, but is expressed by putting the negative sign before the numeral in the present specification.

(1) A silicon carbide semiconductor device 1 according to an embodiment includes a silicon carbide layer 10. Silicon carbide layer 10 has a first main surface 10b and a second main surface 10a opposite to first main surface 10b. Silicon carbide layer 10 includes a drift region 81, a body region 82, and a source region 83. Drift region 81 constitutes first main surface 10b and has a first conductivity type. Body region 82 is provided on drift region 81 and has a second conductivity type different from the first conductivity type. Source region 83 is provided on body region 82 to be separated from drift region 81, constitutes second main surface 10a, and has the first conductivity type. Silicon carbide layer 10 is provided with a trench TR including a first side wall portion SW1 and a first bottom portion BT1, first side wall portion SW1 extending from second main surface 10a to drift region 81 through source region 83 and body region 82, first bottom portion BT1 being in drift region 81. Silicon carbide layer 10 includes a second conductivity type region 2 that is embedded in drift region 81 to face first bottom portion BT1 and that has the second conductivity type. Second conductivity type region 2 is electrically connected to source region 83.

According to silicon carbide semiconductor device 1 according to the above-described embodiment, silicon carbide layer 10 includes second conductivity type region 2 that is embedded in drift region 81 to face bottom portion BT1 of trench TR and that has the second conductivity type. This makes it possible to effectively relax electric field concentration at corner portion 81a at which first bottom portion BT1 and first side wall portion SW1 of trench TR are in contact with each other. As a result, the breakdown voltage of the silicon carbide semiconductor device can be improved effectively. Moreover, second conductivity type region 2 is electrically connected to source region 83. Accordingly, depletion is facilitated when drain voltage is applied, thereby facilitating decrease of capacitance. Accordingly, the silicon carbide semiconductor device is improved in high speed responsiveness, thereby improving a switching characteristic.

(2) Preferably in silicon carbide semiconductor device 1 according to (1), second conductivity type region 2 has a mesh structure when viewed in a plan view. Accordingly, while securing a wide current path, electric field concentration at corner portion 81a of trench TR can be relaxed.

(3) Preferably, silicon carbide semiconductor device 1 according to (1) or (2) further includes a metal region 96. Metal region 96 is in contact with source region 83. Source region 83 and second conductivity type region 2 are electrically connected to each other via metal region 96. Accordingly, the switching characteristic of the silicon carbide semiconductor device can be improved effectively. Here, the expression "source region 83 and second conductivity type region 2 are electrically connected to each other via metal region 96" is intended to indicate that metal region 96 is included in a portion of an electric circuit connecting source region 83 and second conductivity type region 2 to each other, and is intended to include a case where the electric circuit connecting source region 83 and second conductivity type region 2 to each other has an electrically conductive region other than metal region 96.

(4) Preferably in silicon carbide semiconductor device 1 according to (3), silicon carbide layer 10 is provided with a stepped portion ST including a second bottom portion BT2 and a second side wall portion SW2, second bottom portion BT2 being between first main surface 10b and second main surface 10a, second side wall portion SW2 connecting second bottom portion BT2 and second main surface 10a to each other. Metal region 96 is in contact with source region 83 in second main surface 10a and is in contact with second bottom portion BT2. Accordingly, second conductivity type region 2 can be electrically connected to source region 83 effectively.

(5) Preferably in silicon carbide semiconductor device 1 according to (4), silicon carbide layer 10 includes a termination region OR and an element region IR surrounded by termination region OR. Stepped portion ST is provided in termination region OR. Accordingly, second conductivity type region 2 can be electrically connected to source region 83 while securing a wide element region IR.

(6) Preferably in silicon carbide semiconductor device 1 according to (5), termination region OR has a guard ring region 3 having the second conductivity type. Metal region 96 is in contact with guard ring region 3 at second bottom portion BT2, and guard ring region 3 is in contact with second conductivity type region 2. Accordingly, the breakdown voltage of the silicon carbide semiconductor device can be improved.

(7) Preferably in silicon carbide semiconductor device 1 according to (6), termination region OR includes a field stop region 4 that surrounds guard ring region 3 when viewed in a plan view and that has the first conductivity type. Field stop region 4 is spaced from second main surface 10a. Accordingly, the breakdown voltage of the silicon carbide semiconductor device can be improved more.

(8) Preferably in silicon carbide semiconductor device 1 according to (5), metal region 96 is directly in contact with second conductivity type region 2 at second bottom portion BT2. Accordingly, the switching characteristic of the silicon carbide semiconductor device can be improved more.

(9) Preferably in silicon carbide semiconductor device 1 according to (4), silicon carbide layer 10 includes a termination region OR and an element region IR surrounded by termination region OR. Stepped portion ST is provided in element region IR. Accordingly, the whole of second conductivity type region 2 can be provided with the same potential as the source region in a short time.

(10) Preferably in silicon carbide semiconductor device 1 according to (9), metal region 96 is directly in contact with second conductivity type region 2 at second bottom portion BT2. Accordingly, the switching characteristic of the silicon carbide semiconductor device can be improved more.

(11) Preferably in silicon carbide semiconductor device 1 according to (1) or (2), source region 83 is in contact with second conductivity type region 2 via body region 82 and a JTE region 5 having the second conductivity type. Accordingly, metal region 96 does not need to be formed in order to connect source region 83 and the second conductivity type region to each other, thereby simplifying the manufacturing process of silicon carbide semiconductor device 1.

(12) Preferably in silicon carbide semiconductor device 1 according to any one of (1) to (11), first bottom portion BT1 of trench TR extends to surround a polygonal cell CL when viewed in a plan view, and when viewed in a plan view, second conductivity type region 2 is provided at a location at which an apex 81a of cell CL overlaps with second conductivity type region 2. Apex 81a of cell CL is a location at which the electric field is likely to be particularly concentrated in the corner portion of trench TR. By providing second conductivity type region 2 to overlap with apex 81a of cell CL, the electric field concentration in corner portion 81a of trench TR can be relaxed effectively.

(13) A method for manufacturing a silicon carbide semiconductor device 1 according to an embodiment includes the following steps. There is prepared a silicon carbide layer 10 having a first main surface 10b and a second main surface 10a opposite to first main surface 10b. A trench TR is formed in second main surface 10a of silicon carbide layer 10. Silicon carbide layer 10 includes a drift region 81, a body region 82, and a source region 83. Drift region 81 constitutes first main surface 10b and has a first conductivity type. Body region 82 is provided on drift region 81 and has a second conductivity type different from the first conductivity type. Source region 83 is provided on body region 82 to be separated from drift region 81, constitutes second main surface 10a, and has the first conductivity type. Trench TR includes a first side wall portion SW1 and a first bottom portion BT1, first side wall portion SW1 extending from second main surface 10a to drift region 81 through source region 83 and body region 82, first bottom portion BT1 being in drift region 81. Silicon carbide layer 10 includes a second conductivity type region 2 that is embedded in drift region 81 to face first bottom portion BT1 and that has the second conductivity type. Second conductivity type region 2 is electrically connected to source region 83.

According to a method for manufacturing silicon carbide semiconductor device 1 according to the embodiment, silicon carbide layer 10 includes second conductivity type region 2 that is embedded in drift region 81 to face first bottom portion BT1 of trench TR and that has second conductivity type. This makes it possible to effectively relax electric field concentration at corner portion 81a at which first bottom portion BT1 and first side wall portion SW1 of trench TR are in contact with each other. As a result, the breakdown voltage of the silicon carbide semiconductor device can be improved effectively. Moreover, second conductivity type region 2 is electrically connected to source region 83. Accordingly, depletion is facilitated when drain voltage is applied, thereby facilitating decrease of capacitance. Accordingly, the silicon carbide semiconductor device is improved in high speed responsiveness, thereby improving a switching characteristic.

(14) Preferably in the method for manufacturing silicon carbide semiconductor device 1 according to (13), a stepped portion ST is formed in second main surface 10a of silicon carbide layer 10, stepped portion ST including a second bottom portion BT2 and a second side wall portion SW2, second bottom portion BT2 being between first main surface 10b and second main surface 10a, second side wall portion SW2 connecting second bottom portion BT2 and second main surface 10a to each other. A metal region 96 is formed in contact with source region 83 and second bottom portion BT2. Accordingly, second conductivity type region 2 can be electrically connected to source region 83 effectively.

(15) Preferably in method for manufacturing silicon carbide semiconductor device 1 according to (14), stepped portion ST is formed by thermal etching. Accordingly, stepped portion ST can be formed effectively.

Details of Embodiments of the Invention of the Present Application

Next, the embodiments of the present invention will be described more in detail.

First Embodiment

With reference to FIG. 1, the following describes a structure of a MOSFET 1 serving as a silicon carbide semiconductor device of a first embodiment. MOSFET 1 according to the first embodiment includes a silicon carbide layer 10, a silicon carbide single crystal substrate 80, gate insulating films 91, gate electrodes 92, interlayer insulating films 93, metal regions 96, and a drain electrode 98.

Silicon carbide layer 10 is an epitaxial layer made of silicon carbide, and includes a first main surface 10b and a second main surface 10a opposite to the first main surface. Silicon carbide single crystal substrate 80 is made of, for example, hexagonal silicon carbide single crystal having polytype 4H. First main surface 10b of silicon carbide layer 10 is in contact with silicon carbide single crystal substrate 80. Silicon carbide layer 10 mainly includes a drift region 81, body regions 82, source regions 83, contact regions 84, a p type region 2, and connection regions 2a. Silicon carbide layer 10 includes an element region IR and a termination region OR surrounding element region IR (see FIG. 10). Termination region OR may include a guard ring region 3 (see FIG. 10) and a field stop region 4 (see FIG. 10).

Drift region 81 is an n type (first conductivity type) region including an impurity such as nitrogen, for example. Drift region 81 constitutes first main surface 10b of silicon carbide layer 10. Drift region 81 has a lower drift region 81c and an upper drift region 81d. Upper drift region 81d is provided on lower drift region 81c. P type region 2 is partially provided in contact with an interface between lower drift region 81c and upper drift region 81d. Drift region 81 preferably has an impurity concentration lower than the impurity concentration of silicon carbide single crystal substrate 80. Drift region 81 preferably has a donor concentration of not less than $1\times10^{15}$ cm$^{-3}$ and not more than $5\times10^{16}$ cm$^{-3}$, for example, $8\times10^{15}$ cm$^{-3}$. The thickness of lower drift region 81c and the thickness of upper drift region 81d are 9 μm and 3 respectively, for example.

Body region 82 is a p type (second conductivity type) region including an impurity such as aluminum or boron, for example. Body region 82 is provided on upper drift region 81d. Body region 82 preferably has an acceptor concentration of not less than $1\times10^{17}$ cm$^{-3}$ and not more than $5\times10^{18}$ cm$^{-3}$. The acceptor concentration of body region 82 is higher than the donor concentration of drift region 81.

Source region 83 is an n type region including an impurity such as phosphorus, for example. Source region 83 is provided on body region 82 to be separated from drift region 81 by body region 82. Source region 83 has a donor concentration of, for example, about $2\times10^{19}$ cm$^{-3}$. The donor concentration of source region 83 is higher than the acceptor concentration of body region 82. Source region 83 and contact region 84 constitute second main surface 10a of silicon carbide layer 10.

Contact region 84 is a p type region including an impurity such as aluminum, for example. Contact region 84 is provided to be surrounded by source region 83 and is connected to body region 82. The acceptor concentration of contact region 84 is higher than the acceptor concentration of body region 82. The acceptor concentration of contact region 84 is about $1\times10^{20}$ cm$^{-3}$, for example. A cell CL is formed by contact region 84, source region 84, body region 82, and drift region 81.

A (gate) trench TR is provided in second main surface 10a of silicon carbide layer 10. Trench TR includes a first side wall portion SW1 and a first bottom portion BT1. First side wall portion SW1 extends from second main surface 10a of silicon carbide layer 10 to upper drift region 81d through source region 83 and body region 82. First bottom portion BT1 is continuously connected to first side wall portion SW1, and is in upper drift region 81d. On body region 82, first side wall portion SW1 includes a channel surface of MOSFET 1.

First side wall portion SW1 is inclined relative to second main surface 10a of silicon carbide layer 10. When viewed in a cross section (field of view in a direction parallel to first main surface 10b), trench TR is expanded in a tapered manner toward its opening. In the present embodiment, first bottom portion BT1 is substantially parallel to second main surface 10a, and has a flat shape. A portion at which first bottom portion BT1 and first side wall portion SW1 are connected to each other is a corner portion 81b of trench TR.

Silicon carbide layer 10 is provided with stepped portions ST each including: a second bottom portion BT2 between first main surface 10b and second main surface 10a of silicon carbide layer 10; and a second side wall portion SW2 that connects second bottom portion BT2 and second main surface 10a to each other. In the present embodiment, stepped portion ST is provided in element region IR. Preferably, second bottom portion BT2 of stepped portion ST is provided at a location closer to first main surface 10b relative to first bottom portion BT1 of trench TR. Preferably, when viewed in a cross section, the width of second bottom portion BT2 of stepped portion ST is wider than the width of first bottom portion BT1 of trench TR. Stepped portion ST is provided not to constitute a part of the plurality of cells CL provided in element region IR. The number of stepped portions ST is less than the number of cells CL.

Each of p type region 2 (second conductivity type region) and connection region 2a is a p type region including an impurity such as aluminum, for example. P type region 2 is provided to be embedded in drift region 81. P type region 2 is provided to be spaced from first bottom portion BT1 of trench TR. Preferably, p type region 2 is located at the first main surface 10b side relative to first bottom portion BT1 of trench TR. Preferably, p type region 2 is separated from body region 82 by not less than 1 μm and not more than 5 μm. Each of p type region 2 and connection region 2a has a dose amount of, for example, not less than $1\times10^{12}$ cm$^{-2}$ and not more than $1\times10^{15}$ cm$^{-2}$, preferably, not less than $1\times10^{13}$ cm$^{-2}$ and not more than $5\times10^{13}$ cm$^{-2}$. Connection region 2a is provided in contact with second bottom portion BT2 of stepped portion ST. Connection region 2a and p type region 2 may be a p type region 2 obtained by, for example, forming simultaneously connection region 2a and p type region 2 to be substantially in one piece. In this case, metal region 96 is connected directly to p type region 2.

Figure 2:
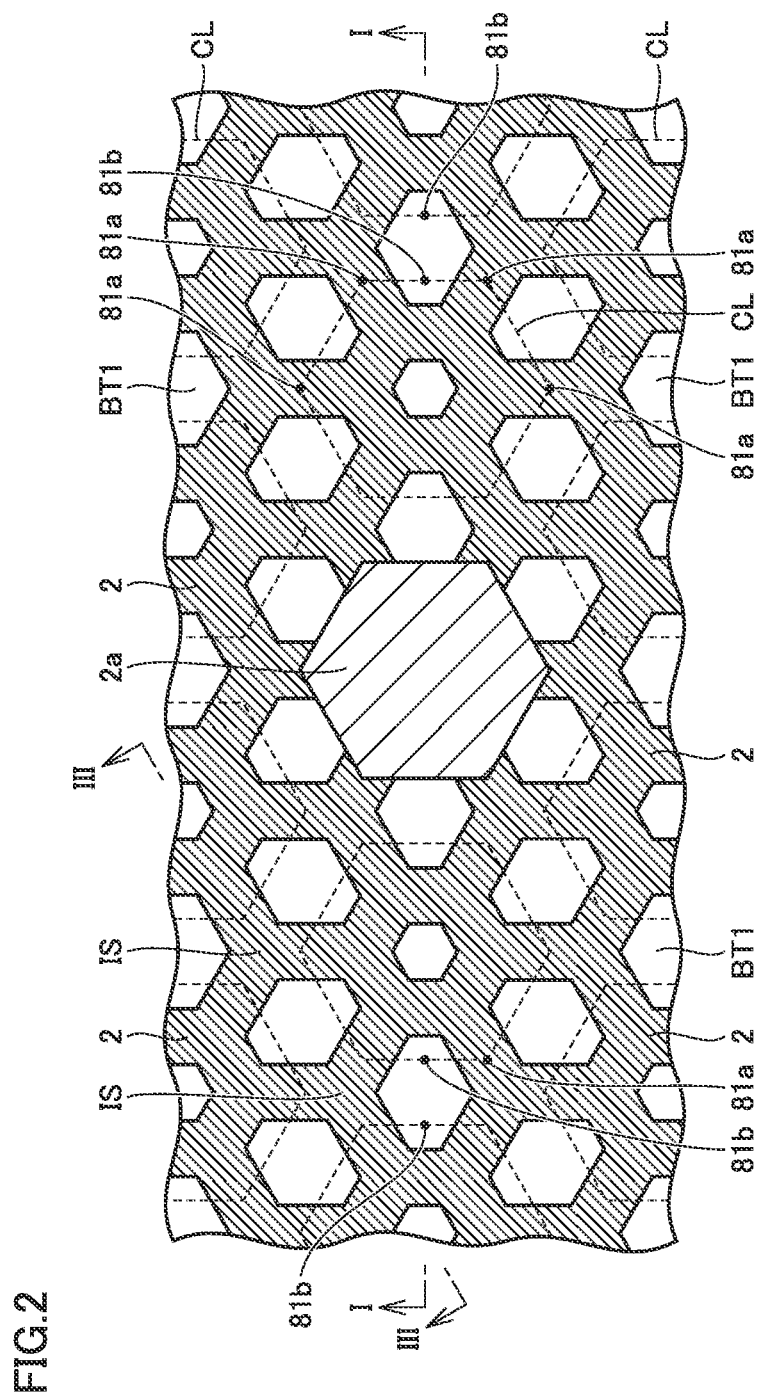
FIG. 2 is a schematic plan view showing the configuration of the silicon carbide semiconductor device according to the first embodiment of the present invention.

FIG. 2 shows a plane of MOSFET 1 taken along a region II-II of FIG. 1. With reference to FIG. 2, p type region 2 has a mesh structure when viewed in a plan view (field of view in the normal direction of first main surface 10b). In FIG. 2, a region of a hexagon (polygon) surrounded by a broken line represents a planar shape of upper drift region 81d when viewed at a location of first bottom portion BT1 of trench TR. A region between adjacent hexagonal cells CL is first bottom portion BT1 of trench TR. In other words, when viewed in a plan view, first bottom portion BT1 of trench TR extends to surround hexagonal (polygonal) cell CL. When viewed in a plan view, p type region 2 is provided at a location at which each of all the apexes 81a of hexagonal (polygonal) cell CL overlaps with p type region 2.

An apex 81a of hexagonal cell CL, which is a portion at which first side wall portion SW1 and first bottom portion BT1 of trench TR cross each other, is a first corner portion 81a of trench TR, whereas a portion between two adjacent apexes of the hexagon is a second corner portion 81b of trench TR. In first corner portion 81a, electric field concentration is more likely to take place than that in second corner portion 81b, thus resulting in high electric field strength. Preferably, when viewed in a plan view, p type region 2 is provided at a location overlapping with first corner portion 81a of trench TR and not overlapping with second corner portion 81b of trench TR. Accordingly, electric field concentration at first corner portion 81a of trench TR can be relaxed effectively while securing a current path.

When viewed in a plan view, first bottom portion BT1 of trench TR has a honeycomb structure. When viewed in a plan view, p type region 2 is located at locations overlapping with intersections IS of the honeycomb structure, and has a mesh structure having a shape that does not overlap with a portion of a line segment connecting two adjacent intersections IS of the honeycomb structure to each other. When viewed in a plan view, connection region 2a has a shape of hexagon (polygon), for example. As shown in FIG. 2, connection region 2a is in contact with p type region 2 at each of the apexes of the hexagon.

Figure 3:
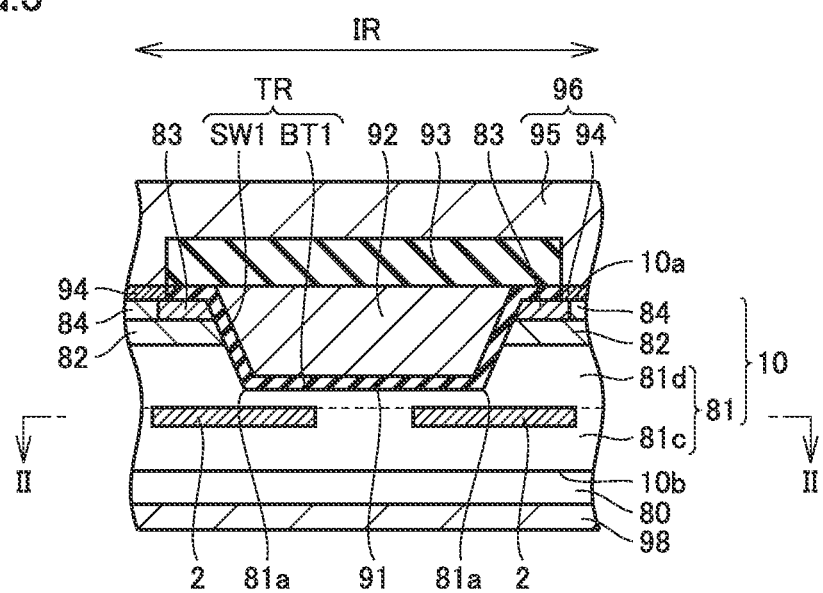
FIG. 3 is a schematic cross sectional view in a region of FIG. 2.

FIG. 3 shows a plane of MOSFET 1 taken along a region of FIG. 2. With reference to FIG. 3, p type region 2 is provided at a location facing a portion of first bottom portion BT1 of trench TR when viewed in a cross section. In other words, when viewed in a plan view, p type region 2 and first bottom portion BT1 of trench TR are partially overlapped with each other. P type region 2 is provided at a location facing source region 83 and body region 82. Moreover, p type region 2 is provided at a location on a tangential line of first side wall portion SW1 and first bottom portion BT1 of trench TR so as to face apex 81a of hexagonal cell CL.

With reference to FIG. 1, gate insulating film 91 covers each of first side wall portion SW1 and first bottom portion BT1 of trench TR. Gate insulating film 91 is provided on body region 82 to connect source region 83 and upper drift region 81d to each other. Gate insulating film 91 may be in contact with second side wall portion SW2 and second bottom portion BT2, which constitute stepped portion ST. Gate electrode 92 is in contact with gate insulating film 91 and is provided in trench TR. Interlayer insulating film 93 is provided in contact with gate electrode 92 and gate insulating film 91 to electrically insulate gate electrode 92 and a source electrode 94 from each other. Interlayer insulating film 93 may be provided on gate insulating film 91 provided in contact with second side wall portion SW2 and second bottom portion BT2, which constitute stepped portion ST. Interlayer insulating film 93 is made of, for example, silicon dioxide.

Metal region 96 includes source electrode 94, a source interconnection layer 95, and a contact electrode 94a. Source electrode 94 is in contact with each of source region 83 and contact region 84. Source interconnection layer 95 is provided on and in contact with source electrode 94. Source interconnection layer 95 is, for example, an aluminum layer. Interlayer insulating film 93 insulates between gate electrode 92 and source interconnection layer 95. Contact electrode 94a is in contact with connection region 2a at second bottom portion BT2 of stepped portion ST. Contact electrode 94a may be in contact with gate insulating film 91. Source interconnection layer 95 extends from source electrode 94 to come into stepped portion ST via above interlayer insulating film 93, and is in contact with contact electrode 94a. Metal region 96 is in contact with source region 83 and contact region 84 in second main surface 10a of silicon carbide layer 10 and is also in contact with second bottom portion BT2 of stepped portion ST.

Source region 83 is electrically connected to p type region 2 via metal region 96. Source region 83 is in ohmic contact with source electrode 94. Source region 83 is electrically connected to p type region 2 via source electrode 94, source interconnection layer 95, contact electrode 94a, and connection region 2a.

Preferably, each of first side wall portion SW1 of trench TR and second side wall portion SW2 of stepped portion ST includes a special plane. The special plane is a plane including a first plane having a plane orientation of {0-33-8}. More preferably, the special plane microscopically includes the first plane and microscopically further includes a second plane having a plane orientation of {0-11-1}. Further preferably, the first plane and the second plane include a combined plane having a plane orientation of {0-11-2}. Moreover, the special plane is a plane macroscopically having an off angle of 62°±10° relative to the {000-1} plane.

Next, the following describes an example of a method for manufacturing MOSFET 1 serving as the silicon carbide semiconductor device according to the present embodiment.

Figure 4:
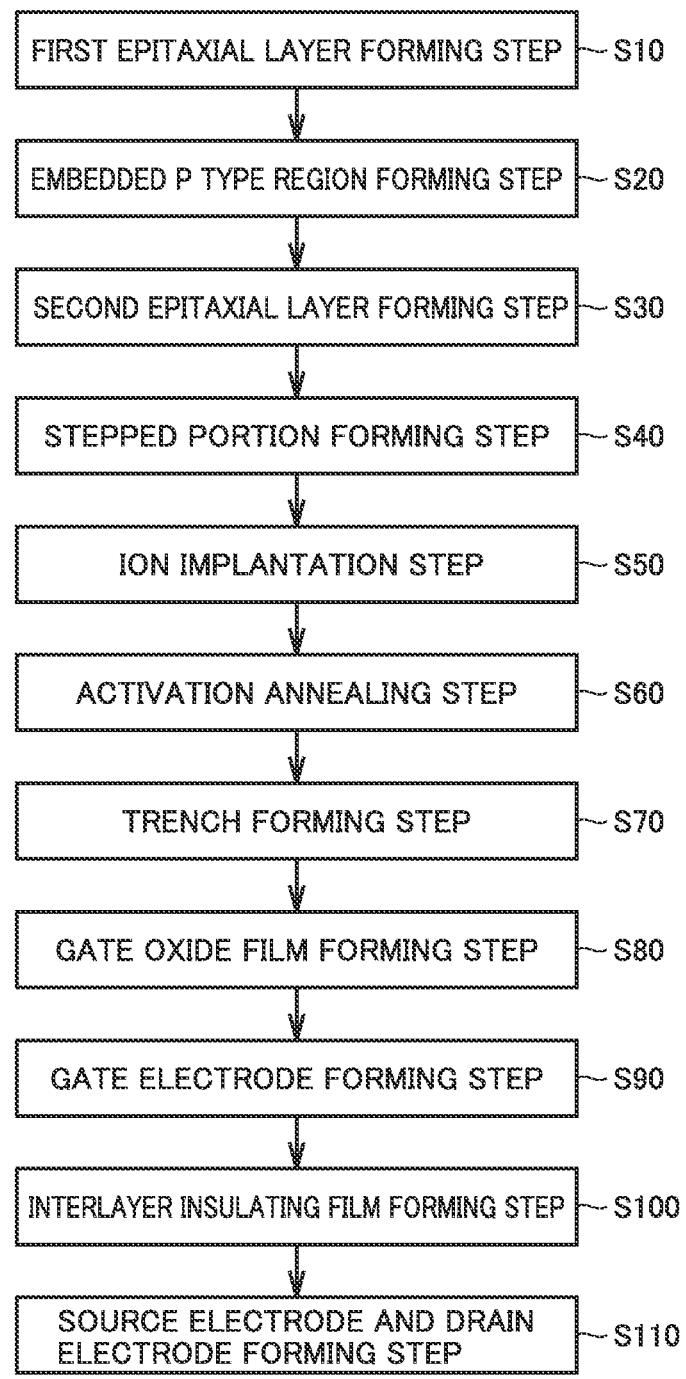
FIG. 4 is a flowchart schematically showing a method for manufacturing a silicon carbide semiconductor device according to the first embodiment of the present invention.
Figure 5:
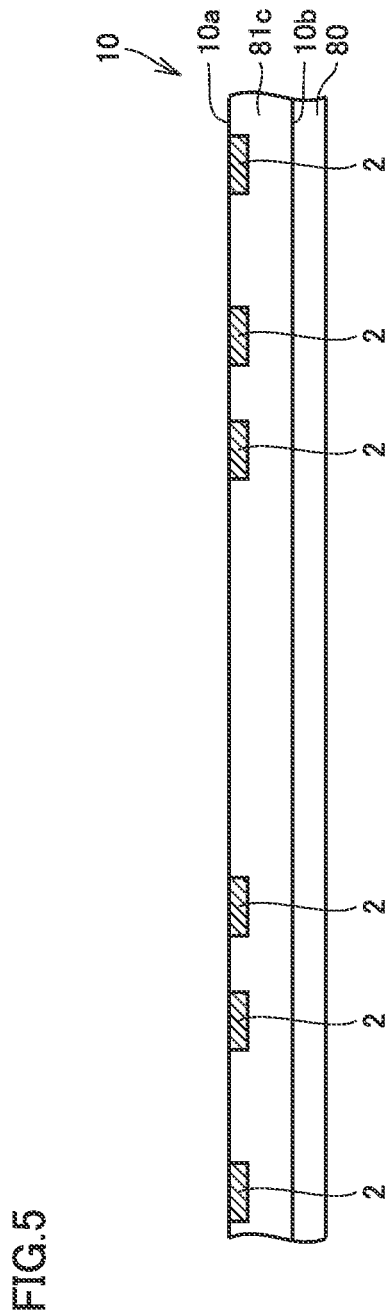
FIG. 5 is a schematic cross sectional view schematically showing a first step of the method for manufacturing the silicon carbide semiconductor device according to the first embodiment of the present invention.

First, a first epitaxial layer forming step (FIG. 4: S10) is performed. As shown in FIG. 5, lower drift region 81c, which is to serve as a portion of drift region 81 (FIG. 1), is formed on silicon carbide single crystal substrate 80. Specifically, lower drift region 81c is formed by epitaxial growth on silicon carbide single crystal substrate 80. This epitaxial growth can be achieved by employing a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. On this occasion, an impurity (donor) such as nitrogen (N) or phosphorus (P) is preferably introduced as an impurity, for example. The concentration of the impurity in lower drift region 81c such as nitrogen is, for example, about $7.0 \times 10^{15}$ $cm^3$. The thickness of lower drift region 81c is about 9 µm, for example.

Next, an embedded p type region forming step (FIG. 4: S20) is performed. In a portion of lower drift region 81c, p type region 2 having p type conductivity is formed. Specifically, acceptor ions (impurity ions for providing second conductivity type) such as aluminum are implanted into lower drift region 81c using an implantation mask (not shown), thereby forming p type region 2. The dose amount of aluminum ions is about $3 \times 10^{13}$ $cm^{-2}$, for example.

Figure 6:
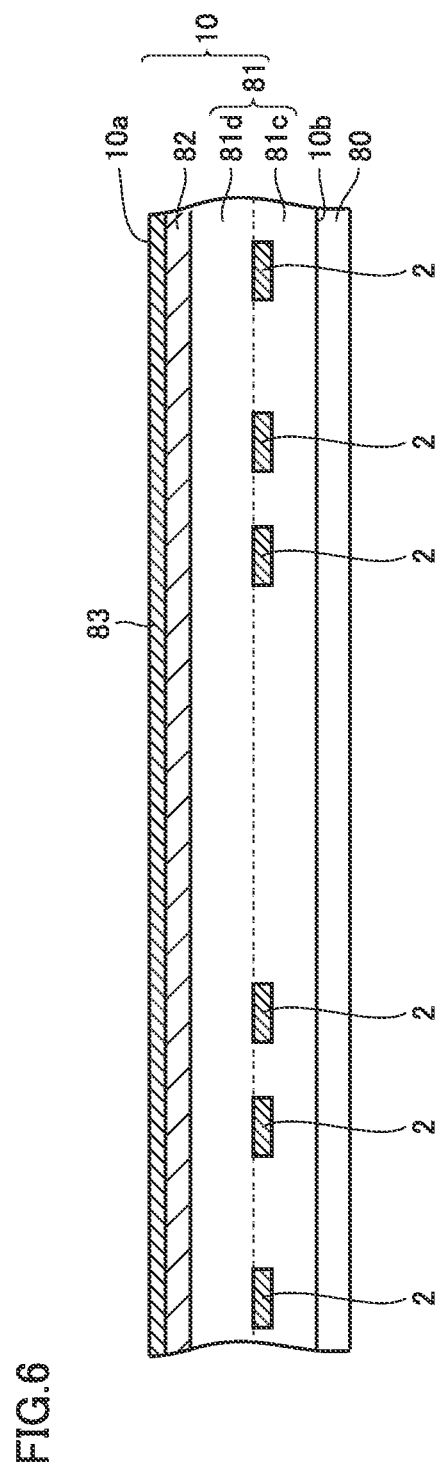
FIG. 6 is a schematic cross sectional view schematically showing a second step of the method for manufacturing the silicon carbide semiconductor device according to the first embodiment of the present invention.

Next, a second epitaxial layer forming step (FIG. 4: S30) is performed. As shown in FIG. 6, after the formation of p type region 2, upper drift region 81d having n type is formed on lower drift region 81c having n type. Accordingly, p type region 2 is embedded in drift region 81 constituted of lower drift region 81c and upper drift region 81d. Upper drift region 81d can be formed by the same method as the method for forming lower drift region 81c. The concentration of the impurity in upper drift region 81d such as nitrogen is, for example, about $1.0 \times 10^{16}$ $cm^3$. Upper drift region 81d has a thickness of, for example, about 3 µm.

Next, body region 82 and source region 83 are formed on drift region 81. They can be formed by ion implantations into drift region 81, for example. In the ion implantation for forming body region 82, ions of an impurity for providing p type such as aluminum (Al) are implanted. Meanwhile, in the ion implantation for forming source region 83, ions of an impurity for providing n type conductivity such as phosphorus (P) are implanted, for example. It should be noted that instead of the ion implantations, epitaxial growth involving addition of impurities may be employed.

Drift region 81, body region 82, source region 83, contact region 84, and p type region 2 constitute silicon carbide layer 10 having first main surface 10b and second main surface 10a. Drift region 81 constitutes first main surface 10b and source region 83 constitutes second main surface 10a. In this way, silicon carbide layer 10 is prepared which has first main surface 10b and second main surface 10a opposite to first main surface 10b.

Next, a stepped portion forming step (FIG. 5: S40) is performed. Specifically, a mask layer (not shown) having an opening is formed on second main surface 10a constituted of source region 83. As a mask layer, a silicon oxide film or the like can be used, for example. The opening is formed in conformity with the location of stepped portion ST (FIG. 1).

In the opening of the mask layer, source region 83, body region 82, and a portion of drift region 81 are removed by etching. An exemplary, usable etching method is Reactive Ion Etching (RIE), in particular, Inductive Coupling Plasma (ICP) RIE. Specifically, for example, ICP-RIE can be used which employs $SF_6$ or a mixed gas of $SF_6$ and $O_2$ as a reactive gas. With such etching, a recess having a side wall substantially perpendicular to second main surface 10a is formed in the region in which stepped portion ST (FIG. 1) is to be formed.

Next, thermal etching is performed in the recess. This thermal etching can be performed by, for example, heating in an atmosphere containing reactive gas having at least one or more types of halogen atom. The at least one or more types of halogen atom include at least one of chlorine (Cl) atom and fluorine (F) atom. This atmosphere is, for example, $Cl_2$, $BCL_3$, $SF_6$, or $CF_4$. For example, the thermal etching is performed using a mixed gas of chlorine gas and oxygen gas as a reactive gas, at a heat treatment temperature of, for example, not less than 700° C. and not more than 1000° C.

It should be noted that the reactive gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is approximately, for example, 70 μm/hour. In addition, in this case, the mask layer, which is formed of silicon oxide and therefore has a very large selection ratio relative to SiC, is not substantially etched during the etching of SiC.

Figure 7:
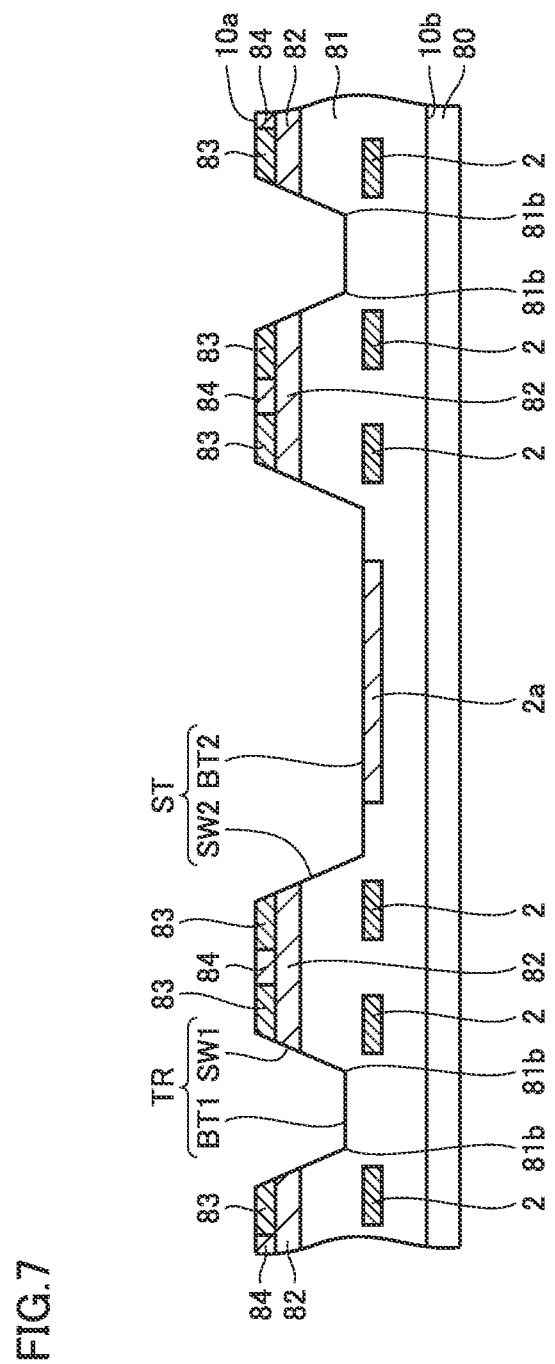
FIG. 7 is a schematic cross sectional view schematically showing a third step of the method for manufacturing the silicon carbide semiconductor device according to the first embodiment of the present invention.

As shown in FIG. 7, by the thermal etching, stepped portion ST is formed in second main surface 10a of silicon carbide layer 10. Stepped portion ST includes: second side wall portion SW2 extending to drift region 81 through source region 83 and body region 82; and second bottom portion BT2 located on drift region 81. Preferably, during the formation of stepped portion ST, the special plane described above is spontaneously formed on second side wall portion SW2, in particular, on body region 82. Next, the mask layer is removed by an appropriate method such as etching.

Next, an ion implantation step (FIG. 4: S50) is performed. An ion implantation mask layer is formed on second main surface 10a of silicon carbide layer 10 to have an opening in conformity with regions in which contact region 84 (FIG. 1) and connection region 2a (FIG. 1) are to be formed. Aluminum ions or the like are implanted into silicon carbide layer 10 using the mask layer, thereby forming contact region 84 and connection region 2a both having p type conductivity. It should be noted that contact region 84 and connection region 2a may be formed simultaneously or may be formed separately.

Next, an activation annealing step (FIG. 4: S60) is performed. In order to activate the impurity implanted in silicon carbide layer 10 by the ion implantation step, heat treatment is performed onto silicon carbide layer 10. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as Ar atmosphere.

Next, a trench forming step (FIG. 5: S70) is performed. The trench forming step can be performed in the same manner as that in the stepped portion forming step (FIG. 5: S40) described above. Specifically, a mask layer having an opening is formed on the surface constituted of source region 83 and contact region 84. As the mask layer, a silicon oxide film or the like can be used, for example. The opening is formed in conformity with the location of trench TR (FIG. 1). In the opening of the mask layer, source region 83, body region 82, and a portion of drift region 81 are removed by etching. The etching is performed using ICP-RIE that employs $SF_6$ or a mixed gas of $SF_6$ and $O_2$ as a reactive gas, for example. With the etching, a recess having a side wall substantially perpendicular to second main surface 10a is formed in the region in which trench TR (FIG. 1) is to be formed.

Next, thermal etching is performed in the recess. This thermal etching can be performed by, for example, heating in an atmosphere containing reactive gas having at least one or more types of halogen atom. The at least one or more types of halogen atom include at least one of chlorine (Cl) atom and fluorine (F) atom. This atmosphere is, for example, $Cl_2$, $BCL_3$, $SF_6$, or $CF_4$. For example, the thermal etching is performed using a mixed gas of chlorine gas and oxygen gas as a reactive gas, at a heat treatment temperature of, for example, not less than 700° C. and not more than 1000° C. It should be noted that the reactive gas may contain a carrier gas in addition to the chlorine gas and the oxygen gas. An exemplary, usable carrier gas is nitrogen ($N_2$) gas, argon gas, helium gas, or the like.

With the thermal etching, trench TR is formed in second main surface 10a of silicon carbide layer 10. Trench TR includes: a first side wall portion SW1 extending to drift region 81 through source region 83 and body region 82; and first bottom portion BT1 in drift region 81. Each of first side wall portion SW1 and first bottom portion BT1 is distant away from p type region 2. Preferably, during the formation of trench TR, the special plane is spontaneously formed on first side wall portion SW1, in particular, on body region 82. Next, the mask layer is removed by an appropriate method such as etching.

It should be noted that both the trench forming step (FIG. 4: S70) and the stepped portion forming step (FIG. 4: S40) are performed employing thermal etching, but the thermal etching time in the stepped portion forming step may be longer than the thermal etching time in the trench forming step. Accordingly, second bottom portion BT2 constituting stepped portion ST is formed at a location closer to first main surface 10b relative to first bottom portion BT1 of trench TR. The depth of trench TR, in other words, distance between second main surface 10a of silicon carbide layer 10 and first bottom portion BT1 of trench TR in the normal direction of first main surface 10b of silicon carbide layer 10 is, for example, about not less than 1.0 μm and not more than 1.8 μm. The depth of stepped portion ST, in other words, distance between second main surface 10a of silicon carbide layer 10 and second bottom portion BT2 of stepped portion ST in the normal direction of first main surface 10b of silicon carbide layer 10 is, for example, about not less than 1.1 μm and not more than 3.0 μm.

Next, a gate oxide film forming step (FIG. 4: S80) is performed. Gate insulating film 91 is formed to cover first side wall portion SW1 and first bottom portion BT1 of trench TR and second side wall portion SW2 and second bottom portion BT2 of stepped portion ST. Gate insulating film 91 may be formed, for example, by thermal oxidation. After the formation of gate insulating film 91, NO annealing may be performed using nitrogen monoxide (NO) gas as an atmospheric gas. A temperature profile has such a condition that the temperature is not less than 1100° C. and not more than 1300° C. and holding time is approximately 1 hour, for example. Accordingly, nitrogen atoms are introduced into an interface region between gate insulating film 91 and body region 82. As a result, formation of interface states in the interface region is suppressed, thereby achieving improved channel mobility. It should be noted that a gas other than the NO gas can be employed as the atmospheric gas as long as the nitrogen atoms can be thus introduced. After this NO annealing, Ar annealing may be further performed using argon (Ar) as an atmospheric gas. The Ar annealing is preferably performed at a heating temperature equal to or higher than the heating temperature in the above-described NO annealing and lower than the melting point of gate insulating film 91. This heating temperature is held for approximately 1 hour, for example. Accordingly, interface states are further suppressed from being formed in the interface region between gate insulating film 91 and body region 82. It should be noted that instead of the Ar gas, a different inert gas such as nitrogen gas can be employed as the atmospheric gas.

Next, a gate electrode forming step (FIG. 4: S90) is performed. Gate electrode 92 is formed on and in contact with gate insulating film 91. Specifically, gate electrode 92 is formed on gate insulating film 91 to fill the region in trench TR with gate electrode 92. A method for forming gate electrode 92 can be performed by, for example, forming a film of conductor or doped polysilicon and performing CMP (Chemical Mechanical Polishing).

Next, an interlayer insulating film forming step (FIG. 4: S100) is performed. Interlayer insulating film 93 is formed on gate electrode 92 and gate insulating film 91 so as to cover the exposed surface of gate electrode 92. Interlayer insulating film 93 is formed on and in contact with gate insulating film 93 formed on second side wall portion SW2 and second bottom portion BT2 both constituting stepped portion ST.

Next, a source electrode and drain electrode forming step (FIG. 4: S110) is performed. In order to form an opening in interlayer insulating film 93 and gate insulating film 91, interlayer insulating film 93 and gate insulating film 91 are etched. Through the opening, each of source region 83 and contact region 84 is exposed on second main surface 10a. Next, on second main surface 10a, source electrode 94 is formed in contact with each of source region 83 and contact region 84.

Likewise, gate insulating film 91 and interlayer insulating film 93 are etched to expose connection region 2a in second bottom portion BT2 of stepped portion ST. Next, in second bottom portion BT2 of stepped portion ST, contact electrode 94a is formed in contact with connection region 2a. Contact electrode 94a and source electrode 94 may be formed simultaneously or may be formed separately. Next, source interconnection layer 95 is formed in contact with source electrode 94, contact electrode 94a, and interlayer insulating film 93. In this way, metal region 96 is formed in contact with source region 83 and second bottom portion BT2 of stepped portion ST. Moreover, drain electrode 98 is formed on first main surface 10b constituted of drift region 81, with silicon carbide single crystal substrate 80 being interposed therebetween.

Next, the following describes function and effect of MOSFET 1 serving as the silicon carbide semiconductor device according to the first embodiment.

According to MOSFET 1 according to the first embodiment, silicon carbide layer 10 has p type region 2 that is embedded in drift region 81 to face first bottom portion BT1 of trench TR and that has p type. This makes it possible to effectively relax electric field concentration at corner portion 81a at which first bottom portion BT1 and first side wall portion SW1 of trench TR are in contact with each other. As a result, the breakdown voltage of MOSFET 1 can be improved effectively. Moreover, p type region 2 is electrically connected to source region 83. Accordingly, depletion is facilitated when drain voltage is applied, thereby facilitating decrease of capacitance. Accordingly, MOSFET 1 is improved in high speed responsiveness, thereby improving a switching characteristic.

Moreover, according to MOSFET 1 according to the first embodiment, p type region 2 has a mesh structure when viewed in a plan view. Accordingly, while securing a wide current path, electric field concentration at corner portion 81a of trench TR can be relaxed. Moreover, p type region 2 is expanded in one piece in drift region 81 to have the mesh structure. If there are a plurality of p type regions 2 and are isolated from one another, source electrode 94 needs to be electrically connected to each p type region 2. In this case, in order to electrically connect source electrode 94 to each of the plurality of p type regions 2, a multiplicity of source trenches need to be formed. On the other hand, according to MOSFET 1 according to the first embodiment, p type region 2 is in one piece to have the mesh structure. Hence, a multiplicity of source trenches do not need to be provided to electrically connect p type regions 2 and source electrodes 94 to one another, whereby cell pitch in MOSFET 1 can be reduced. As a result, the on resistance of MOSFET 1 can be reduced.

Further, MOSFET 1 according to the first embodiment further includes metal region 96. Metal region 96 is in contact with source region 83. Source region 83 and p type region 2 are electrically connected to each other via metal region 96. Accordingly, the switching characteristic of MOSFET 1 can be improved effectively.

Furthermore, according to MOSFET 1 according to the first embodiment, silicon carbide layer 10 is provided with stepped portion ST constituted of second bottom portion BT2 and second side wall portion SW2, second bottom portion BT2 being between first main surface 10b and second main surface 10a, second side wall portion SW2 connecting second bottom portion BT2 and second main surface 10a to each other. Metal region 96 is in contact with source region 83 in second main surface 10a, and is in contact with second bottom portion BT2. Accordingly, p type region 2 can be electrically effectively connected to source region 83.

Furthermore, according to MOSFET 1 according to the first embodiment, silicon carbide layer 10 includes termination region OR and element region IR surrounded by termination region OR. Stepped portion ST is provided in element region IR. Accordingly, the whole of p type region 2 can be provided with the same potential as source region 83 in a short time.

Furthermore, according to MOSFET 1 according to the first embodiment, metal region 96 is directly in contact with p type region 2 in second bottom portion BT2. Accordingly, the switching characteristic of MOSFET 1 can be improved more.

Furthermore, according to MOSFET 1 according to the first embodiment, the first bottom portion of trench TR extends to surround polygonal cell CL when viewed in a plan view, and p type region 2 is provided at a location at which apex 81a of cell CL overlaps with p type region 2 when viewed in a plan view. Apex 81a of cell CL is a location at which the electric field is likely to be particularly concentrated in the corner portion of trench TR. By providing p type region 2 to overlap with apex 81a of the cell, the electric field concentration in corner portion 81a of trench TR can be relaxed effectively.

According to a method for manufacturing MOSFET 1 according to the first embodiment, silicon carbide layer 10 includes p type region 2 that is embedded in drift region 81 to face first bottom portion BT1 of trench TR and that has p type. This makes it possible to effectively relax electric field concentration at corner portion 81a at which first bottom portion BT1 and first side wall portion SW1 of trench TR are in contact with each other. As a result, the breakdown voltage of MOSFET 1 can be improved effectively. Moreover, p type region 2 is electrically connected to source region 83. Accordingly, depletion is facilitated when drain voltage is applied, thereby facilitating decrease of capacitance. Accordingly, MOSFET 1 is improved in high speed responsiveness, thereby improving a switching characteristic.

Further, according to the method for manufacturing MOSFET 1 according to the first embodiment, stepped portion ST constituted of second bottom portion BT2 and second side wall portion SW2 is formed in second main surface 10a of silicon carbide layer 10, second bottom portion BT2 being between first main surface 10b and second main surface 10a, second side wall portion SW2 connecting second bottom portion BT2 and second main surface 10a to each other. Metal region 96 is formed in contact with source region 83 and second bottom portion BT2. Accordingly, p type region 2 can be electrically effectively connected to source region 83.

Furthermore, according to the method for manufacturing MOSFET 1 according to the first embodiment, stepped portion ST is formed by thermal etching. Accordingly, stepped portion ST can be formed effectively.

Second Embodiment

Next, the following describes a configuration of a MOSFET 1 according to a second embodiment. The configuration of MOSFET 1 according to the second embodiment is mainly different from the configuration of MOSFET 1 according to the first embodiment in terms of the shape of p type region 2. Apart from this, MOSFET 1 has substantially the same configuration as MOSFET 1 according to the first embodiment. The following mainly describes the difference from the configuration of MOSFET 1 according to the first embodiment.

Figure 8:
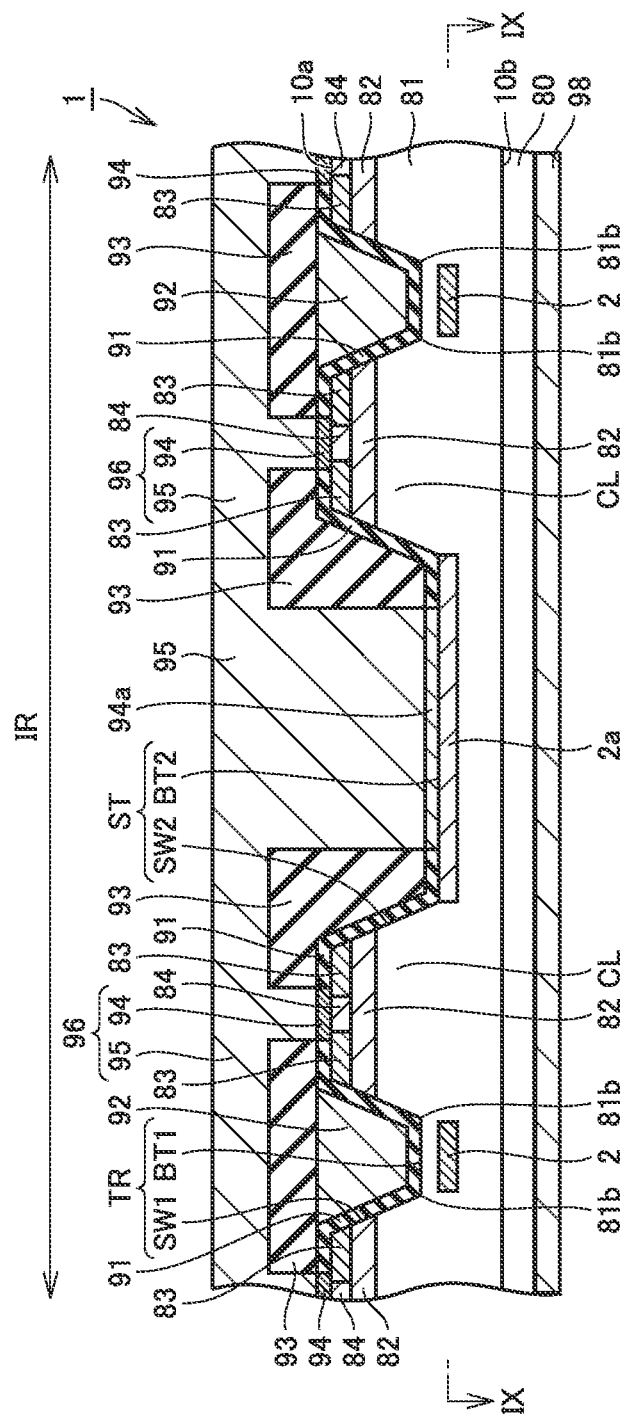
FIG. 8 is a schematic cross sectional view showing a configuration of a silicon carbide semiconductor device according to a second embodiment of the present invention.

With reference to FIG. 8, p type region 2 of MOSFET 1 according to the second embodiment is provided at a location facing first bottom portion BT1 of trench TR. When viewed in a cross section, the width of p type region 2 in the direction parallel to first main surface 10b may be less than the width of first bottom portion BT1 of trench TR. Connection region 2a is provided in contact with contact electrode 94a. Connection region 2a may be in contact with gate insulating film 91 in second bottom portion BT2 of stepped portion ST. When viewed in a cross section, the width of connection region 2a in the direction parallel to first main surface 10b may be larger than the width of contact electrode 94a.

Figure 9:
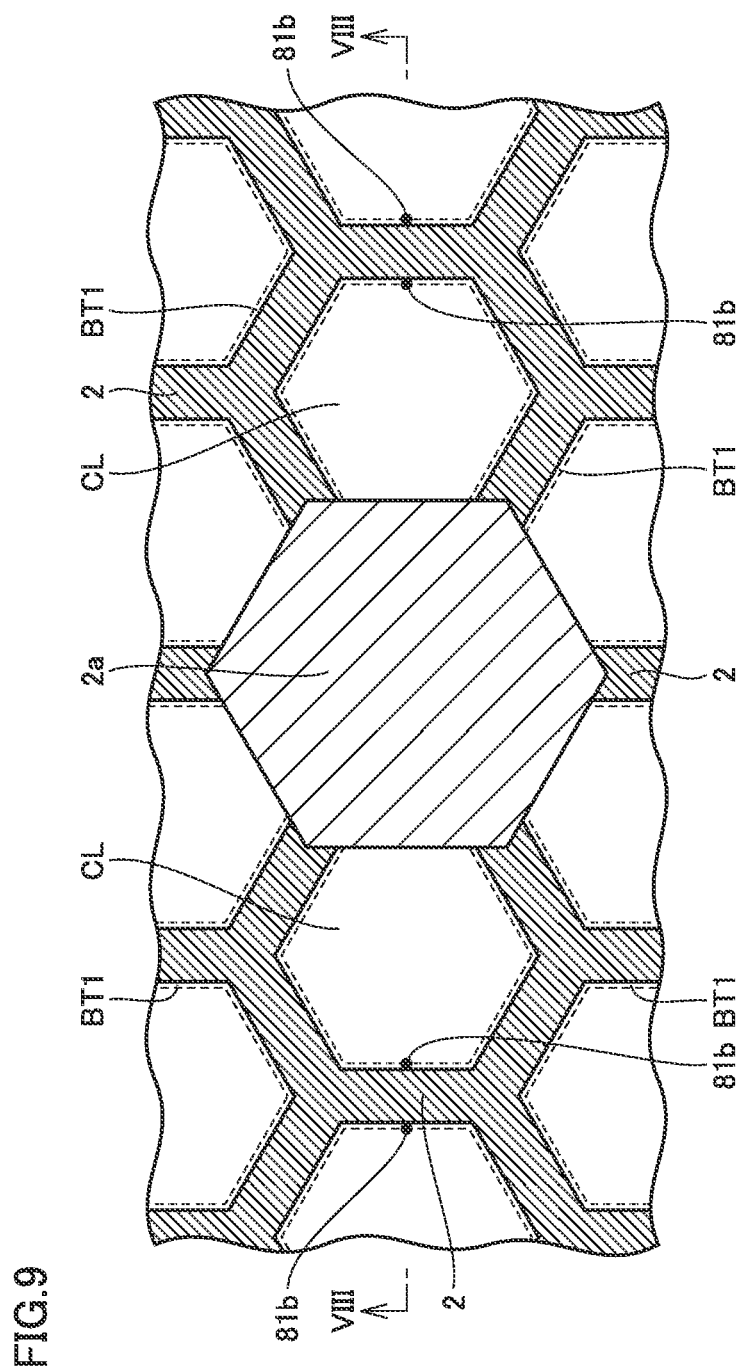
FIG. 9 is a schematic plan view showing the configuration of the silicon carbide semiconductor device according to the second embodiment of the present invention.

FIG. 9 shows a plane of MOSFET 1 taken along a region IX-IX of FIG. 8. With reference to FIG. 9, p type region 2 has a mesh structure when viewed in a plan view. In FIG. 9, a region of a hexagon (polygon) surrounded by a broken line represents a planar shape of upper drift region 81d when viewed at a location of first bottom portion BT1 of trench TR. A region between adjacent hexagonal cells CL is first bottom portion BT1 of trench TR. In other words, when viewed in a plan view, first bottom portion BT1 of trench TR extends to surround hexagonal cell CL. When viewed in a plan view, p type region 2 of MOSFET 1 according to the second embodiment is provided to surround hexagonal cell CL.

When viewed in a plan view, first bottom portion BT1 of trench TR has a honeycomb structure. P type region 2 is provided to overlap with first bottom portion BT1 of trench TR when viewed in a plan view. That is, p type region 2 also has a honeycomb structure. When viewed in a plan view, connection region 2a has a shape of hexagon (polygon), for example. As shown in FIG. 9, connection region 2a is in contact with p type region 2 at each of the apexes of the hexagon.

Third Embodiment

Next, the following describes a configuration of a MOSFET 1 according to a third embodiment. MOSFET 1 according to the third embodiment is different from the configuration of MOSFET 1 according to the first embodiment in that stepped portion ST is provided in termination region OR. Apart from this, MOSFET 1 according to the third embodiment has substantially the same configuration as that of MOSFET 1 according to the first embodiment. The following mainly describes the difference from the configuration of MOSFET 1 according to the first embodiment.

Figure 10:
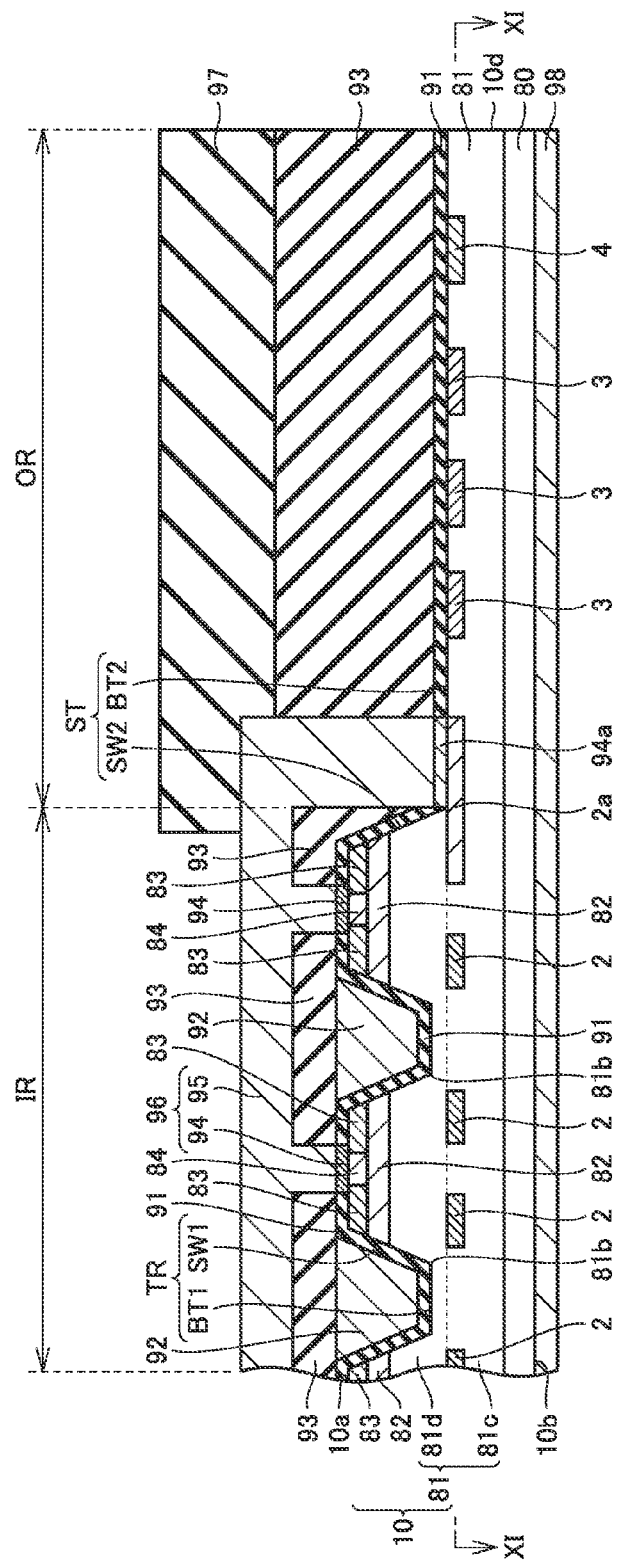
FIG. 10 is a schematic cross sectional view showing a configuration of a silicon carbide semiconductor device according to a third embodiment of the present invention.

With reference to FIG. 10, the following describes a structure of MOSFET 1 serving as a silicon carbide semiconductor device of the third embodiment. Silicon carbide layer 10 of MOSFET 1 according to the third embodiment includes termination region OR and element region IR surrounded by termination region OR. When viewed in a plan view, termination region OR includes: a plurality of guard ring regions 3 provided to surround element region IR; and a field stop region 4 provided to surround guard ring regions 3. Guard ring regions 3 have the same conductivity type (second conductivity type) as p type region 2. The dose amount of guard ring region 3 may be less than the dose amount of p type region 2. The dose amount of acceptor ions such as aluminum ions in guard ring region 3 is, for example, about $1.3 \times 10^{13}$ cm$^{-2}$, and the dose amount of acceptor ions such as aluminum ions in p type region 2 is, for example, about $3.0 \times 10^{13}$ cm$^{-2}$. Field stop region 4 is an n type region in which ions of phosphorus (P) or the like have been implanted, for example. The dose amount of donor ions such as phosphorous ions in field stop region 4 is, for example, about $1.0 \times 10^{13}$ cm$^{-2}$.

Stepped portion ST is provided in second main surface 10a of silicon carbide layer 10. Second bottom portion BT2 of stepped portion ST is provided in termination region OR of silicon carbide layer 10. Insulating film 91 is provided on second bottom portion BT2 of stepped portion ST, and insulating film 93 is provided on insulating film 91. Guard ring regions 3 and field stop region 4 are in contact with insulating film 91 at second bottom portion BT2 of stepped portion ST. A protective film 97 is provided in contact with insulating film 93 and source interconnection layer 95.

Termination region OR is a region including side end portion 10d of silicon carbide layer 10 and external to the outermost cell. Source interconnection layer 95 is provided to electrically connect source electrode 94 and contact electrode 94a to each other, source electrode 94 being in contact with source region 83 and contact region 84 of the cell provided in element region IR, contact electrode 94a being in contact with second bottom portion BT2 of stepped portion ST provided in termination region OR. Connection region 2a is in contact with contact electrode 94a in second bottom portion BT2 of stepped portion ST. Connection region 2a may be provided to extend from termination region OR to element region IR.

Figure 11:
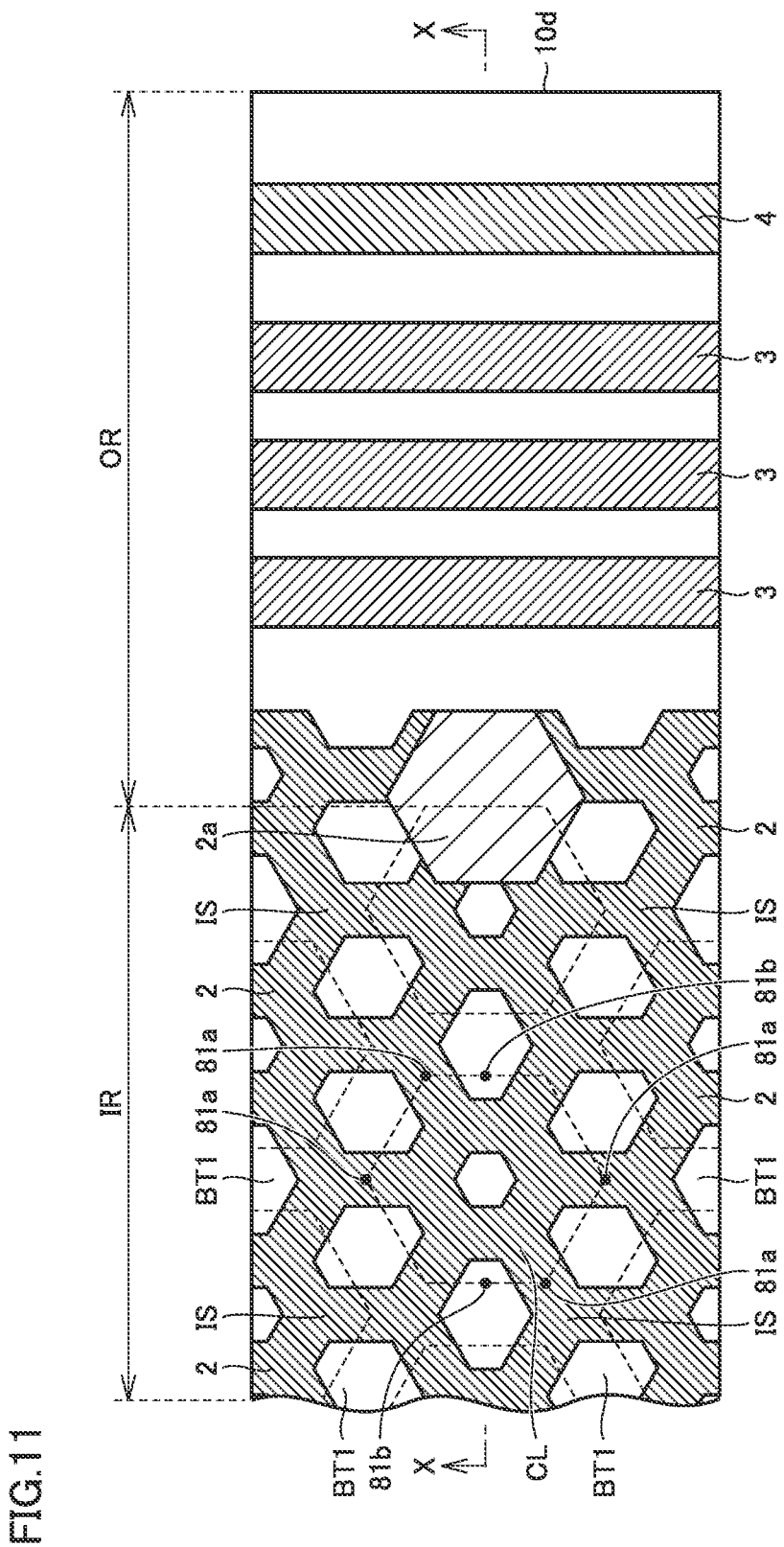
FIG. 11 is a schematic cross sectional view showing the configuration of the silicon carbide semiconductor device according to the third embodiment of the present invention.

FIG. 11 shows a plane of the MOSFET along a region XI-XI of FIG. 10. With reference to FIG. 11, p type region 2 has a mesh structure when viewed in a plan view. In FIG. 11, a region of a hexagon (polygon) surrounded by a broken line represents a planar shape of upper drift region 81d when viewed at a location of first bottom portion BT1 of trench TR. A region between adjacent hexagonal cells CL is first bottom portion BT1 of trench TR. In other words, when viewed in a plan view, first bottom portion BT1 of trench TR extends to surround hexagonal cell CL. When viewed in a plan view, p type region 2 is provided at a location at which each of all the apexes 81a of hexagonal cell CL overlaps with p type region 2.

When viewed in a plan view, first bottom portion BT1 of trench TR has a honeycomb structure. When viewed in a plan view, p type region 2 is at locations overlapping with intersections IS of the honeycomb structure, and has a mesh structure having a shape that does not overlap with a portion of a line connecting intersections IS of the honeycomb structure to each other. When viewed in a plan view, connection region 2a has a shape of hexagon (polygon), for example. As shown in FIG. 11, connection region 2a is in contact with p type region 2 in the outer end portion of p type region 2 when viewed in a plan view.

When viewed in a plan view, guard ring regions 3 and field stop region 4 are provided between p type region 2 and side end portion 10d of silicon carbide layer 10. Guard ring regions 3 extend in the direction parallel to first main surface 10b to surround p type region 2 and connection region 2a. Field stop region 4 is provided at the side end portion 10d side of silicon carbide layer 10 relative to guard ring regions 3. P type region 2 may have a portion in termination region OR.

Next, the following describes an example of a method for manufacturing MOSFET 1 serving as the silicon carbide semiconductor device according to the third embodiment.

Figure 12:
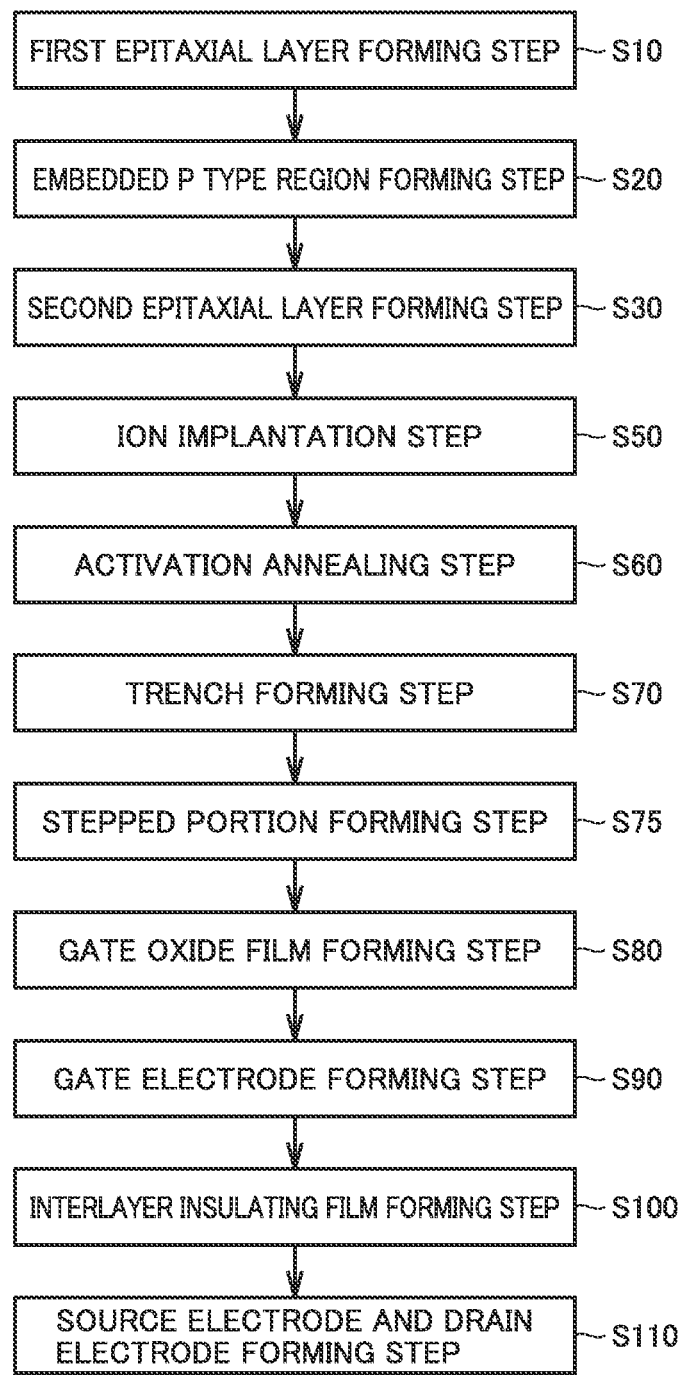
FIG. 12 is a flowchart schematically showing a method for manufacturing the silicon carbide semiconductor device according to the third embodiment of the present invention.

First, a first epitaxial layer forming step (FIG. 12: S10) is performed. The first epitaxial layer forming step is performed in the same manner as described in the first embodiment. Accordingly, lower drift region 81c is formed on silicon carbide single crystal substrate 80. The concentration of the impurity in lower drift region 81c such as nitrogen is, for example, about $7.0 \times 10^{15}$ cm$^3$. The thickness of lower drift region 81c is about 9 μm, for example.

Figure 13:
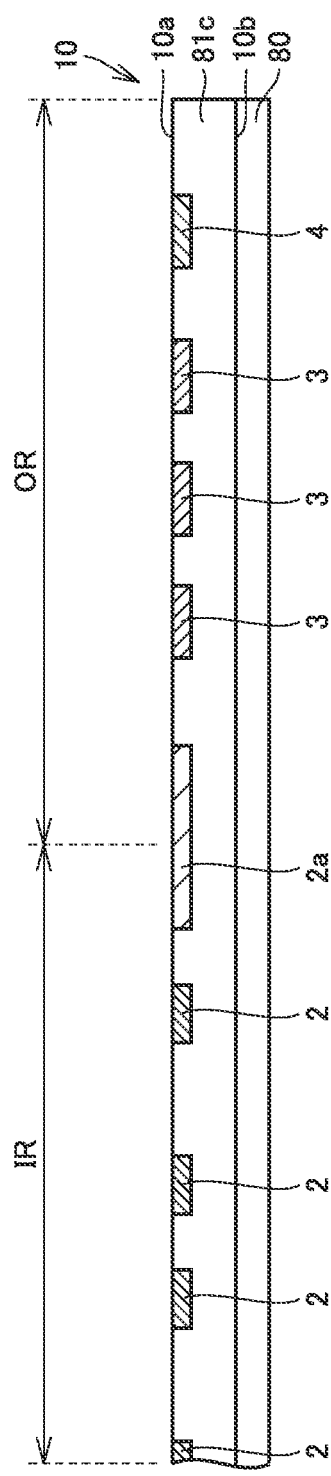
FIG. 13 is a schematic cross sectional view schematically showing a first step of the method for manufacturing the silicon carbide semiconductor device according to the third embodiment of the present invention.

Next, an embedded p type region forming step (FIG. 12: S20) is performed. As shown in FIG. 13, p type region 2, connection region 2a having p type, guard ring regions 3 having p type, and field stop region 4 having n type are formed in part of lower drift region 81c. Specifically, an implantation mask (not shown) is used to implant acceptor ions such as aluminum into lower drift region 81c, thereby forming p type region 2, connection region 2a, and guard ring regions 3. The dose amount of the acceptor ions such as aluminum ions in guard ring regions 3 is, for example, about 1.3 to $1.5 \times 10^{13}$ cm$^{-2}$, and the dose amount of the acceptor ions such as aluminum ions in p type region 2 is, for example, about $3.0 \times 10^{13}$ cm$^{-2}$.

Figure 14:
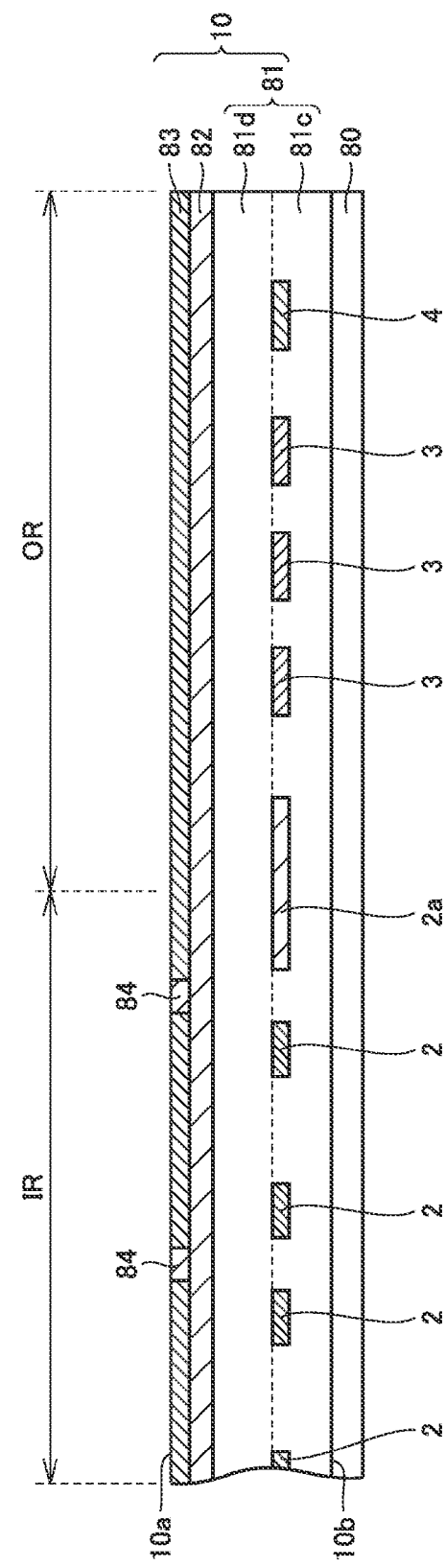
FIG. 14 is a schematic cross sectional view schematically showing a second step of the method for manufacturing the silicon carbide semiconductor device according to the third embodiment of the present invention.

Next, a second epitaxial layer forming step (FIG. 12: S30) is performed. As shown in FIG. 14, after forming p type region 2, connection region 2a, guard ring regions 3, and field stop region 4, upper drift region 81d having n type is formed on lower drift region 81c having n type. Accordingly, p type region 2, connection region 2a, guard ring regions 3, and field stop region 4 are embedded in drift region 81 constituted of lower drift region 81c and upper drift region 81d. Upper drift region 81d can be formed by the same method as the method for forming lower drift region 81c. The concentration of the impurity in upper drift region 81d such as nitrogen is, for example, about $1.0 \times 10^{16}$ cm$^3$. Upper drift region 81d has a thickness of, for example, about 3 μm.

Next, an ion implantation step (FIG. 12: S50) is performed. Specifically, body region 82 and source region 83 are formed on drift region 81. They can be formed by ion implantation into drift region 81, for example. In the ion implantation for forming body region 82, ions of an impurity for providing p type such as aluminum (Al) are implanted. Meanwhile, in the ion implantation for forming source region 83, ions of an impurity for providing n type conductivity such as phosphorus (P) are implanted, for example. It should be noted that instead of the ion implantation, epitaxial growth involving addition of impurities may be employed.

Next, an ion implantation mask layer is formed on second main surface 10a of silicon carbide layer 10 to have an opening in conformity with the region in which contact region 84 (FIG. 10) is to be formed. Aluminum ions or the like are implanted into silicon carbide layer 10 using the mask layer, thereby forming contact region 84 having p type conductivity.

Next, an activation annealing step (FIG. 12: S60) is performed. In order to activate the impurity implanted in silicon carbide layer 10 by the ion implantation step, heat treatment is performed onto silicon carbide layer 10. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as Ar atmosphere.

Next, a trench forming step (FIG. 12: S70) is performed. In the trench forming step, thermal etching described in the first embodiment is performed. Accordingly, trench TR is formed in second main surface 10a of silicon carbide layer 10. Trench TR includes: first side wall portion SW1 extending to drift region 81 through source region 83 and body region 82; and first bottom portion BT1 on drift region 81. Each of first side wall portion SW1 and first bottom portion BT1 is distant away from p type region 2. Preferably, during the formation of trench TR, the special plane is spontaneously formed on first side wall portion SW1, in particular, on body region 82.

Figure 15:
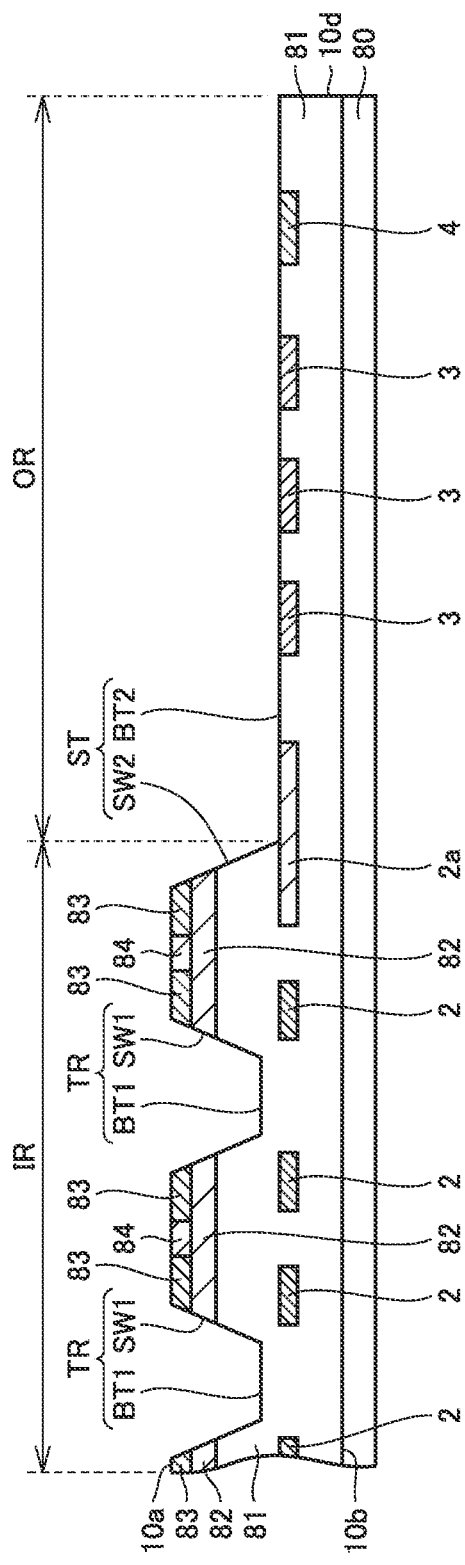
FIG. 15 is a schematic cross sectional view schematically showing a third step of the method for manufacturing the silicon carbide semiconductor device according to the third embodiment of the present invention.

Next, a stepped portion forming step (FIG. 12: S75) is performed. In the stepped portion forming step, the thermal etching described in the first embodiment is performed. With the thermal etching, stepped portion ST is formed in second main surface 10a of silicon carbide layer 10. Stepped portion ST includes: second side wall portion SW2 extending to drift region 81 through source region 83 and body region 82; and second bottom portion BT2 on drift region 81. Preferably, during the formation of stepped portion ST, the special plane described above is spontaneously formed on second side wall portion SW2, in particular, on body region 82. Moreover, stepped portion ST is formed to expose a portion of connection region 2a, guard ring regions 3, and field stop region 4 at second bottom portion BT2 of stepped portion ST. Stepped portion ST may be formed to expose a portion of p type region 2 at second bottom portion BT2 of stepped portion ST. In this way, silicon carbide layer 10 provided with trench TR and stepped portion ST shown in FIG. 15 is formed.

Next, a gate oxide film forming step (FIG. 12: S80) is performed. Gate insulating film 91 is formed to cover first side wall portion SW1 and first bottom portion BT1 of trench TR and second side wall portion SW2 and second bottom portion BT2 of stepped portion ST. Gate insulating film 91 may be formed, for example, by thermal oxidation. After the formation of gate insulating film 91, NO annealing may be performed using nitrogen monoxide (NO) gas as an atmospheric gas.

Next, a gate electrode forming step (FIG. 12: S90) is performed. Gate electrode 92 is formed on and in contact with gate insulating film 91. Specifically, gate electrode 92 is formed on gate insulating film 91 to fill the region in trench TR with gate electrode 92. Gate electrode 92 can be formed by, for example, forming a film of conductor or doped polysilicon and performing CMP.

Next, an interlayer insulating film forming step (FIG. 12: S100) is performed. Interlayer insulating film 93 is formed on gate electrode 92 and gate insulating film 91 to cover the exposed surface of gate electrode 92. Interlayer insulating film 93 is formed on and in contact with gate insulating film 93 formed on second side wall portion SW2 and second bottom portion BT2 both constituting stepped portion ST.

Next, a source electrode and drain electrode forming step (FIG. 12: S110) is performed. In order to form an opening in interlayer insulating film 93 and gate insulating film 91, interlayer insulating film 93 and gate insulating film 91 are etched. Through the opening, each of source region 83 and contact region 84 is exposed on second main surface 10a. Next, on second main surface 10a, source electrode 94 is formed in contact with each of source region 83 and contact region 84.

Likewise, gate insulating film 91 and interlayer insulating film 93 are etched to expose connection region 2a in second bottom portion BT2 of stepped portion ST. Next, in second bottom portion BT2 of stepped portion ST, contact electrode 94a is formed in contact with connection region 2a. Contact electrode 94a and source electrode 94 may be formed simultaneously or may be formed separately. Next, source interconnection layer 95 is formed in contact with source electrode 94, contact electrode 94a, and interlayer insulating film 93. Moreover, drain electrode 98 is formed on first main surface 10b constituted of drift region 81, with silicon carbide single crystal substrate 80 being interposed therebetween.

According to MOSFET 1 according to the third embodiment, silicon carbide layer 10 includes termination region OR and element region IR surrounded by termination region OR. Stepped portion ST is provided in termination region OR. Accordingly, p type region 2 can be electrically connected to source region 83 while securing a wide element region IR.

Fourth Embodiment

Next, the following describes a configuration of a MOSFET 1 according to a fourth embodiment. MOSFET 1 according to the fourth embodiment is different from the configuration of MOSFET 1 according to the third embodiment in that connection region 2a is formed to surround p type region 2 when viewed in a plan view. Apart from this, MOSFET 1 according to the fourth embodiment has substantially the same configuration as that of MOSFET 1 of the third embodiment. The following mainly describes the difference from the configuration of MOSFET 1 according to the third embodiment.

Figure 16:
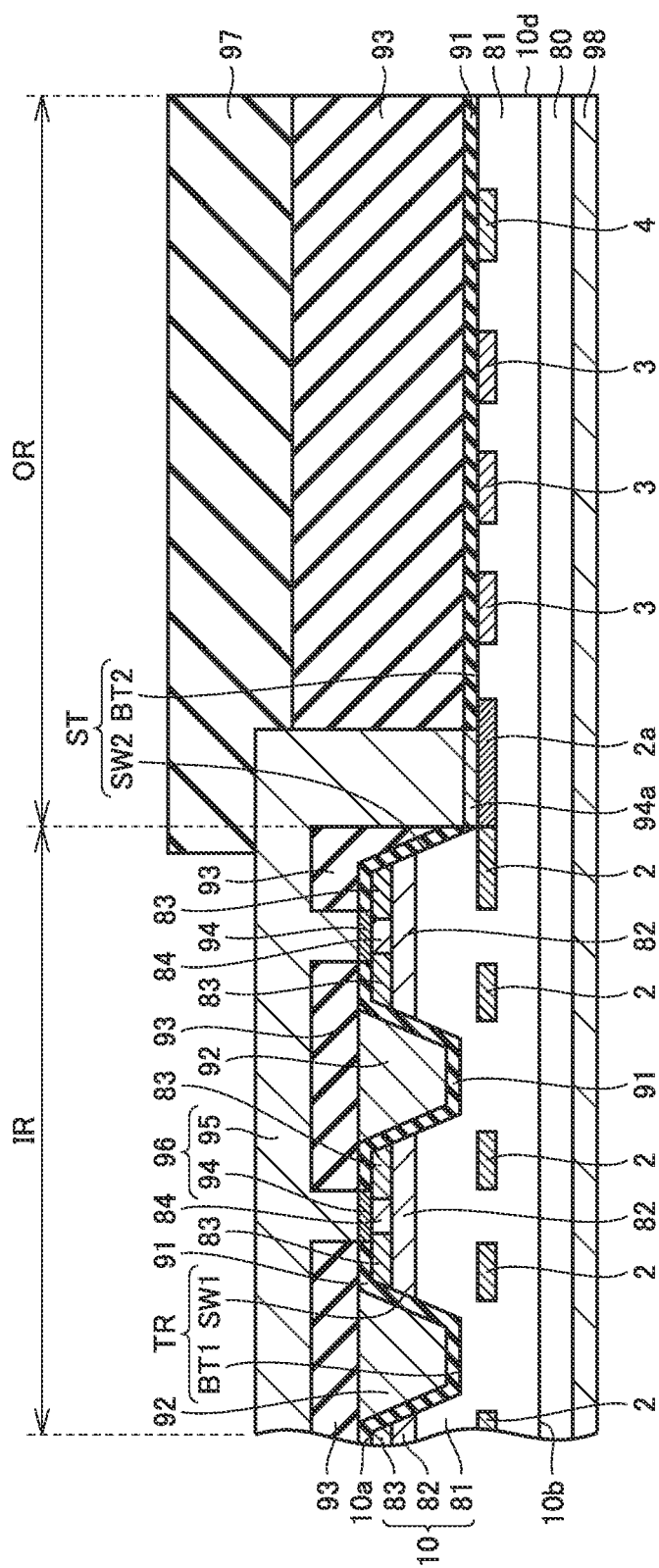
FIG. 16 is a schematic cross sectional view showing a configuration of a silicon carbide semiconductor device according to a fourth embodiment of the present invention.

With reference to FIG. 16, the following describes the structure of MOSFET 1 serving as a silicon carbide semiconductor device of the fourth embodiment. In MOSFET 1 according to the fourth embodiment, silicon carbide layer 10 includes termination region OR and element region IR surrounded by termination region OR. Connection region 2a is provided in termination region OR, and may be connected to p type region 2 at a boundary portion between termination region OR and element region IR. When viewed in a plan view, connection region 2a is a guard ring region provided to surround p type region 2. In second bottom portion BT2 of stepped portion ST, metal region 96 is in contact with connection region 2a serving as the guard ring region. Connection region 2a serving as the guard ring region is in contact with p type region 2. In other words, metal region 96 is connected to p type region 2 via connection region 2a serving as the guard ring region.

According to MOSFET 1 according to the fourth embodiment, termination region OR has guard ring regions 3 having p type. Metal region 96 is in contact with guard ring region 3 in second bottom portion BT2, and guard ring region 3 is in contact with p type region 2. Accordingly, the breakdown voltage of MOSFET 1 can be improved.

Fifth Embodiment

Next, the following describes a configuration of a MOSFET 1 according to a fifth embodiment. MOSFET 1 according to the fifth embodiment is different from the configuration of MOSFET 1 according to the fourth embodiment in that drift region 81 is between field stop region 4 and gate insulating film 91. Apart from this, MOSFET 1 according to the fifth embodiment has substantially the same configuration as that of MOSFET 1 of the fourth embodiment. The following mainly describes the difference from the configuration of MOSFET 1 according to the fourth embodiment.

Figure 17:
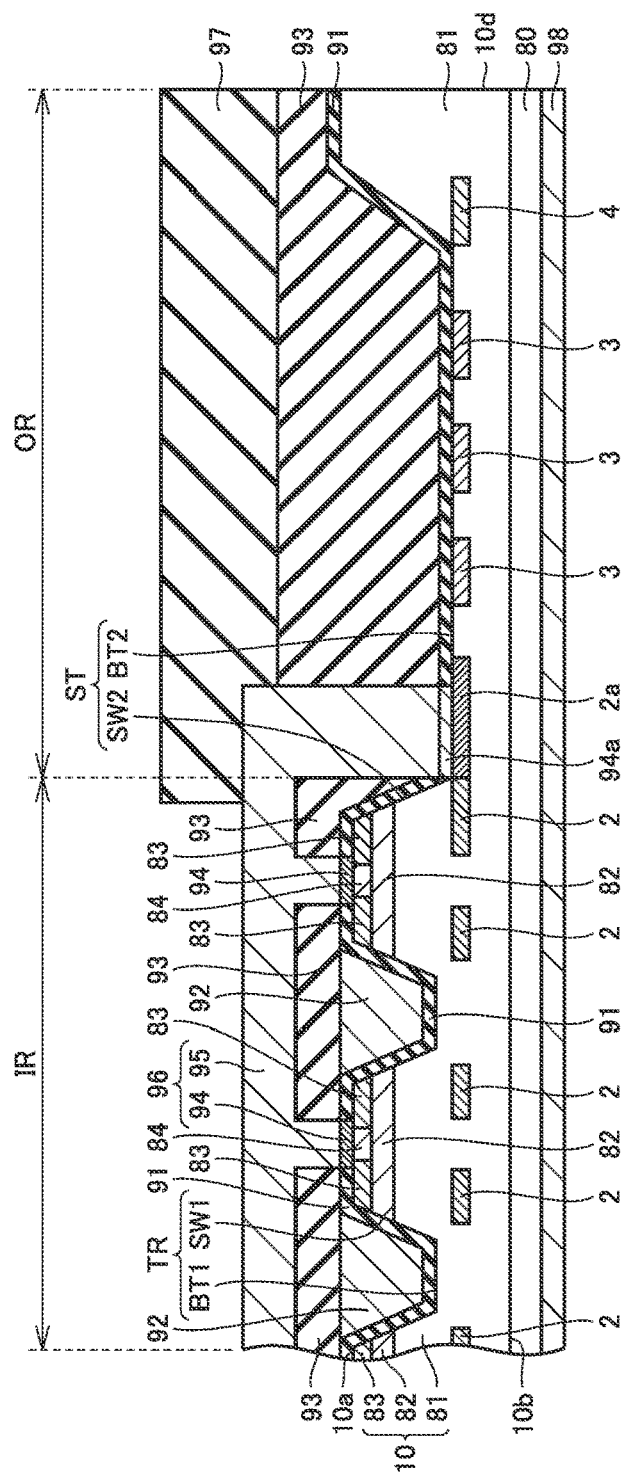
FIG. 17 is a schematic cross sectional view showing a configuration of a silicon carbide semiconductor device according to a fifth embodiment of the present invention.

With reference to FIG. 17, the following describes a structure of MOSFET 1 serving as a silicon carbide semiconductor device of the fifth embodiment. Field stop region 4 of MOSFET 1 according to the fifth embodiment is provided to be spaced from second main surface 10a of silicon carbide layer 10. Moreover, field stop region 4 may be spaced from second bottom portion BT2 of stepped portion ST. In other words, drift region 81 is between field stop region 4 and gate insulating film 91. Second main surface 10a of silicon carbide layer 10 in contact with side end portion 10d of silicon carbide layer 10 is at a location separated from first main surface 10b of silicon carbide layer 10 relative to second bottom portion BT2 of stepped portion ST.

According to MOSFET 1 according to the fifth embodiment, termination region OR includes field stop region 4 having n type and surrounding guard ring region 3 when viewed in a plan view. Field stop region 4 is spaced from second main surface 10a. Accordingly, the breakdown voltage of MOSFET 1 can be improved more.

Sixth Embodiment

Next, the following describes a configuration of a MOSFET 1 according to a sixth embodiment. MOSFET 1 according to the sixth embodiment is different from the configuration of MOSFET 1 according to the fifth embodiment in the following points: drift region 81 is between guard ring regions 3 and gate insulating film 91; and metal region 96 is directly in contact with p type region 2. Apart from this, MOSFET 1 according to the sixth embodiment has substantially the same configuration as that of MOSFET 1 of the fifth embodiment. The following mainly describes the difference from the configuration of MOSFET 1 according to the fifth embodiment.

Figure 18:
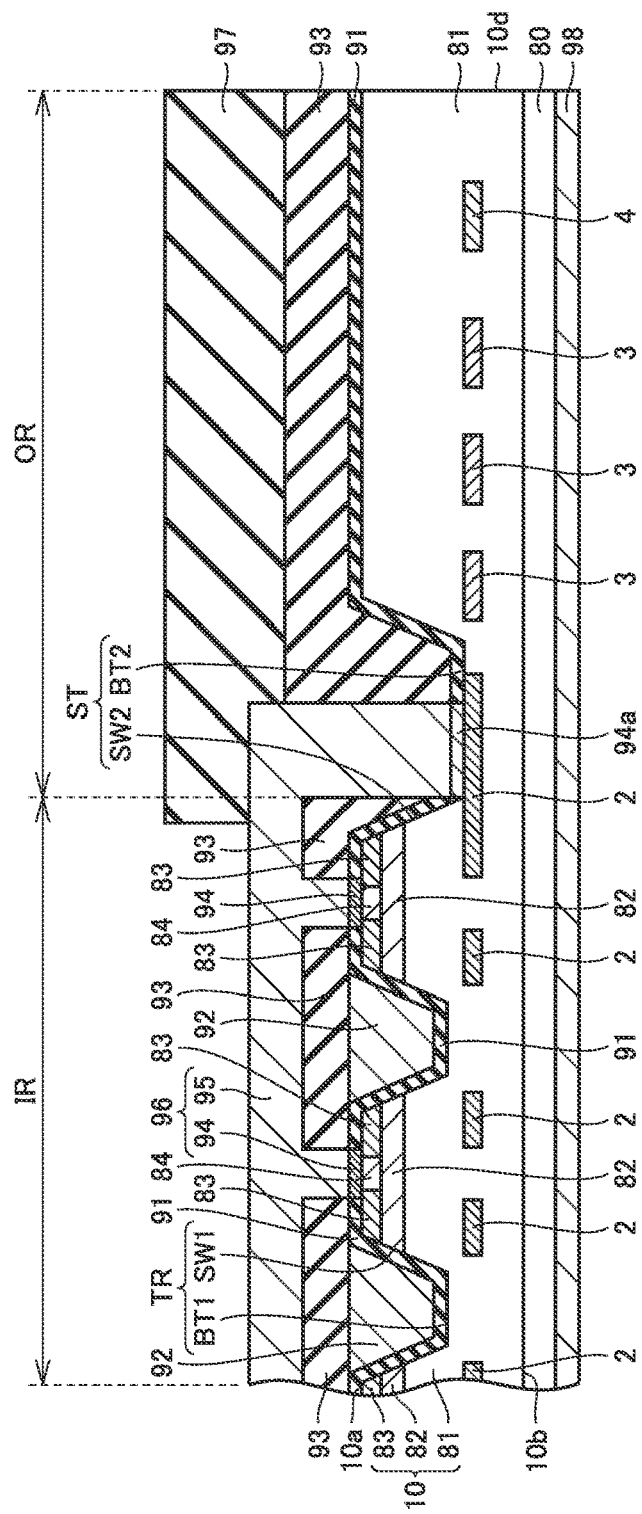
FIG. 18 is a schematic cross sectional view showing a configuration of a silicon carbide semiconductor device according to a sixth embodiment of the present invention.

With reference to FIG. 18, the following describes a structure of MOSFET 1 serving as a silicon carbide semiconductor device of the sixth embodiment. Guard ring regions 3 and field stop region 4 of MOSFET 1 according to the sixth embodiment are provided to be spaced from second main surface 10a of silicon carbide layer 10. Moreover, guard ring regions 3 may be spaced from second bottom portion BT2 of stepped portion ST. Drift region 81 is between gate insulating film 91 and each of guard ring regions 3 and field stop region 4. Guard ring regions 3 and field stop region 4 are embedded in drift region 81. The connection region is p type region 2 substantially in one piece with p type region 2, for example. Metal region 96 is directly in contact with p type region 2 at second bottom portion BT2 of stepped portion ST.

Furthermore, according to MOSFET 1 according to the sixth embodiment, metal region 96 is directly in contact with p type region 2 in second bottom portion BT2. Accordingly, the switching characteristic of MOSFET 1 can be improved more.

Seventh Embodiment

Next, the following describes a configuration of a MOSFET 1 according to a seventh embodiment. MOSFET 1 according to the seventh embodiment is different from the configuration of MOSFET 1 according to the third embodiment in that MOSFET 1 according to the seventh embodiment has a JTE (Junction Termination Extension) region, and metal region 96 is not in contact with second bottom portion BT2 of stepped portion ST. Apart from this, MOSFET 1 according to the seventh embodiment has substantially the same configuration as that of MOSFET 1 of the third embodiment. The following mainly describes the difference from the configuration of MOSFET 1 according to the third embodiment.

Figure 19:
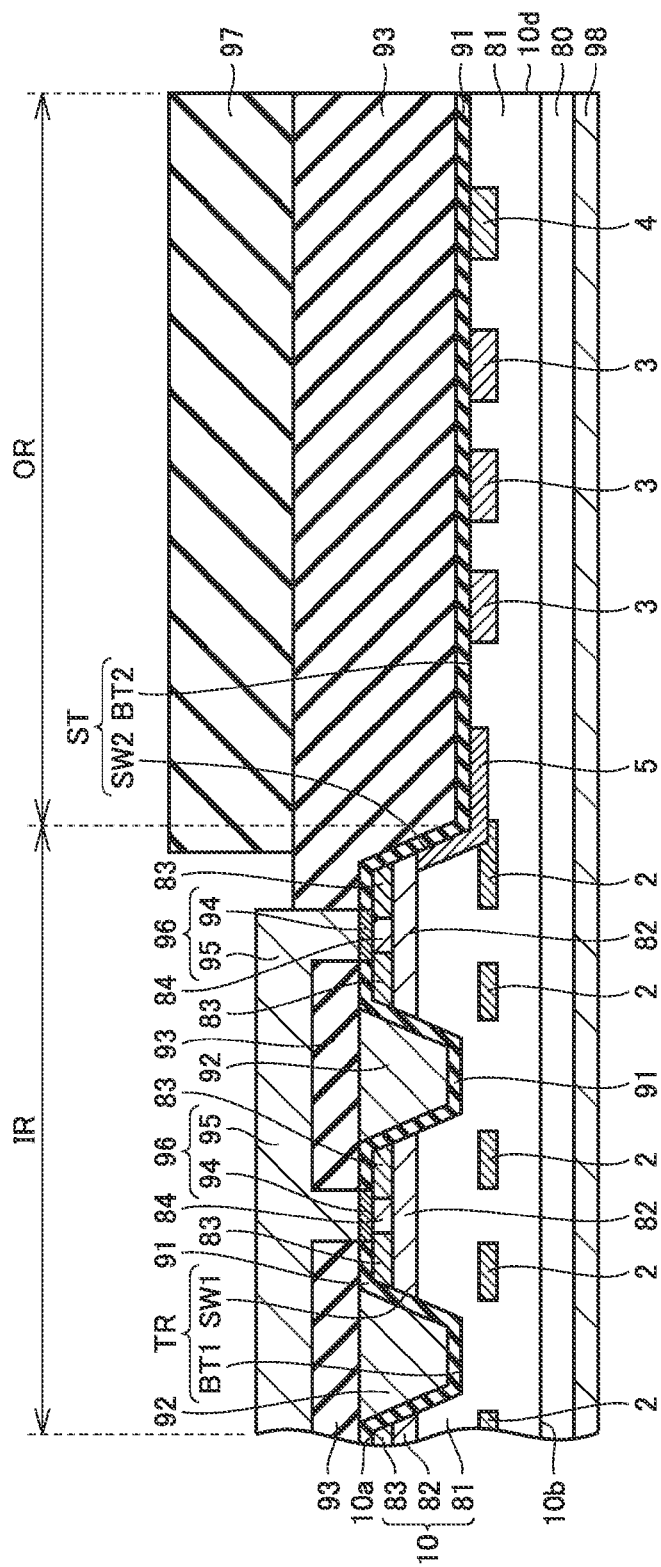
FIG. 19 is a schematic cross sectional view showing a configuration of a silicon carbide semiconductor device according to a seventh embodiment of the present invention.

With reference to FIG. 19, the following describes a structure of MOSFET 1 serving as a silicon carbide semiconductor device of the seventh embodiment. MOSFET 1 according to the seventh embodiment has a JTE region 5. JTE region 5 is a region having p type (second conductivity type). The dose amount of aluminum ions or the like in JTE region 5 is about 1.3 to $1.5 \times 10^{13}$ cm$^{-2}$, for example. JTE region 5 is in contact with gate insulating film 91 in second side wall portion SW2 and second bottom portion BT2 of stepped portion ST. JTE region 5 is in contact with p type region 2 and body region 82. Source electrode 94 is electrically connected to p type region 2 via contact region 84, body region 82, and JTE region 5. Contact region 84 is in contact with source region 83. Source region 83 is in ohmic contact with source electrode 94. JTE region 5 may be provided to surround p type region 2 when viewed in a plan view.

Next, the following describes an example of a method for manufacturing MOSFET 1 serving as the silicon carbide semiconductor device according to the seventh embodiment.

Figure 20:
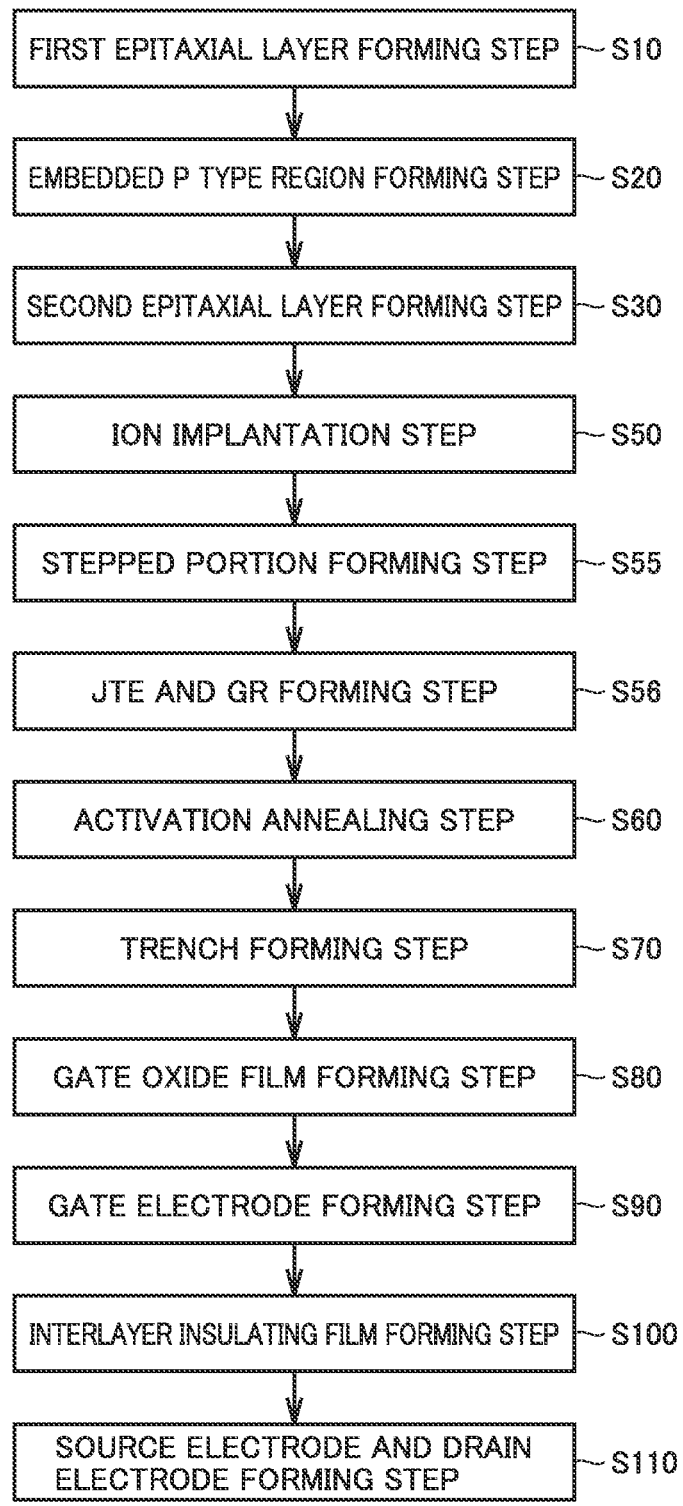
FIG. 20 is a flowchart schematically showing a method for manufacturing the silicon carbide semiconductor device according to the seventh embodiment of the present invention.

First, a first epitaxial layer forming step (FIG. 20: S10) is performed. The first epitaxial layer forming step is performed in the same manner as described in the first embodiment. Accordingly, lower drift region 81c is formed on silicon carbide single crystal substrate 80. Lower drift region 81c includes an impurity such as nitrogen at a concentration of, for example, about $7.0 \times 10^{15}$ cm$^3$. The thickness of lower drift region 81c is about 9 μm, for example.

Next, an embedded p type region forming step (FIG. 20: S20) is performed. Specifically, an implantation mask (not shown) is used to implant acceptor ions such as aluminum into lower drift region 81c, thereby forming p type region 2. The dose amount of aluminum ions is about $3 \times 10^{13}$ cm$^{-2}$, for example.

Next, a second epitaxial layer forming step (FIG. 20: S30) is performed. After forming p type region 2, upper drift region 81d having n type is formed on lower drift region 81c having n type. Accordingly, p type region 2 is embedded in drift region 81 constituted of lower drift region 81c and upper drift region 81d. Upper drift region 81d can be formed by the same method as the method for forming lower drift region 81c. The concentration of the impurity in upper drift region 81d such as nitrogen is, for example, about $1.0 \times 10^{16}$ cm$^3$. Upper drift region 81d has a thickness of, for example, about 3 μm.

Next, an ion implantation step (FIG. 20: S50) is performed. Specifically, body region 82 and source region 83 are formed on drift region 81. They can be formed by ion implantation into drift region 81, for example. In the ion implantation for forming body region 82, ions of an impurity for providing p type such as aluminum (Al) are implanted. Meanwhile, in the ion implantation for forming source region 83, ions of an impurity for providing n type conductivity such as phosphorus (P) are implanted, for example. It should be noted that instead of the ion implantation, epitaxial growth involving addition of impurities may be employed.

Next, an ion implantation mask layer is formed on second main surface 10a of silicon carbide layer 10 to have an opening in conformity with a region in which contact region 84 (FIG. 19) is to be formed. Aluminum ions or the like are implanted into silicon carbide layer 10 using the mask layer, thereby forming contact region 84 having p type conductivity.

Next, a stepped portion forming step (FIG. 20: S55) is performed. In the stepped portion forming step, the thermal etching described in the first embodiment is performed. With the thermal etching, stepped portion ST is formed in second main surface 10a of silicon carbide layer 10. Stepped portion ST includes: second side wall portion SW2 extending to drift region 81 through source region 83 and body region 82; and second bottom portion BT2 on drift region 81. Preferably, during the formation of stepped portion ST, the special plane described above is spontaneously formed on second side wall portion SW2, in particular, on body region 82.

Next, a JTE and GR forming step (FIG. 20: S56) is performed. Specifically, an implantation mask (not shown) is used to implant acceptor ions such as aluminum into second bottom portion BT2 and second side wall portion SW2 of stepped portion ST, thereby forming JTE region 5 in contact with second bottom portion BT2 and second side wall portion SW2 of stepped portion ST, and guard ring regions 3 in contact with second bottom portion BT2 of stepped portion ST. The dose amount of aluminum ions is about $1.3 \times 10^{13}$ cm$^{-2}$, for example. JTE region 5 is formed in contact with p type region 2 and body region 82. Similarly, an implantation mask (not shown) is used to implant donor ions such as phosphorous ions into second bottom portion BT2 of stepped portion ST, thereby forming field stop region 4 in contact with second bottom portion BT2 of stepped portion ST.

Next, an activation annealing step (FIG. 20: S60) is performed. In order to activate the impurities implanted in silicon carbide layer 10 by the ion implantation step, heat treatment is performed onto silicon carbide layer 10. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as Ar atmosphere.

Next, a trench forming step (FIG. 20: S70) is performed. In the trench forming step, thermal etching described in the first embodiment is performed. Accordingly, trench TR is formed in second main surface 10a of silicon carbide layer 10. Trench TR includes: first side wall portion SW1 extending to drift region 81 through source region 83 and body region 82; and first bottom portion BT1 on drift region 81. Each of first side wall portion SW1 and first bottom portion BT1 is distant away from p type region 2. Preferably, during the formation of trench TR, the special plane is spontaneously formed on first side wall portion SW1, in particular, on body region 82.

Next, a gate oxide film forming step (FIG. 20: S80) is performed. Gate insulating film 91 is formed to cover first side wall portion SW1 and first bottom portion BT1 of trench TR and second side wall portion SW2 and second bottom portion BT2 of stepped portion ST. Gate insulating film 91 may be formed, for example, by thermal oxidation. After the formation of gate insulating film 91, NO annealing may be performed using nitrogen monoxide (NO) gas as an atmospheric gas. Gate insulating film 91 is formed in contact with JTE region 5, guard ring regions 3, field stop region 4, body region 82, and source region 83.

Next, a gate electrode forming step (FIG. 20: S90) is performed. Gate electrode 92 is formed on and in contact with gate insulating film 91. Specifically, gate electrode 92 is formed on gate insulating film 91 to fill the region in trench TR with gate electrode 92. Gate electrode 92 can be formed by, for example, forming a film of conductor or doped polysilicon and performing CMP.

Next, an interlayer insulating film forming step (FIG. 20: S100) is performed. Interlayer insulating film 93 is formed on gate electrode 92 and gate insulating film 91 so as to cover the exposed surface of gate electrode 92. Interlayer insulating film 93 is formed on and in contact with gate insulating film 93 formed on second side wall portion SW2 and second bottom portion BT2 both constituting stepped portion ST.

Next, a source electrode and drain electrode forming step (FIG. 20: S110) is performed. In order to form an opening in interlayer insulating film 93 and gate insulating film 91, interlayer insulating film 93 and gate insulating film 91 are etched. Through the opening, each of source region 83 and contact region 84 is exposed on second main surface 10a. Next, on second main surface 10a, source electrode 94 is formed in contact with each of source region 83 and contact region 84. Next, source interconnection layer 95 is formed in contact with source electrode 94, contact electrode 94a, and interlayer insulating film 93. Moreover, drain electrode 98 is formed on first main surface 10b constituted of drift region 81, with silicon carbide single crystal substrate 80 being interposed therebetween.

According to MOSFET 1 according to the seventh embodiment, source region 83 is in contact with p type region 2 via body region 82 and JTE region 5 having p type. Accordingly, metal region 96 does not need to be formed in order to connect source region 83 and p type region 2 to each other, thereby simplifying the manufacturing process of MOSFET 1.

It should be noted that in each of the embodiments described above, a MOSFET has been exemplified and illustrated as the silicon carbide semiconductor device, but the silicon carbide semiconductor device may be an IGBT (Insulated Gate Bipolar Transistor) or the like, for example. Moreover, in each of the embodiments described above, it has been illustrated that n type corresponds to the first conductivity type and p type corresponds to the second conductivity type; however, p type may correspond to the first conductivity type and n type may correspond to the second conductivity type.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: silicon carbide semiconductor device (MOSFET); 2: second conductivity type region (p type region); 2a: connection region; 3: guard ring region; 4: field stop region; 10: silicon carbide layer; 10a: second main surface; 10b: first main surface; 10d: side end portion; 80: silicon carbide single crystal substrate; 81: drift region; 81a: first corner portion (apex); 81b: second corner portion; 81c: lower drift region; 81d: upper drift region; 82: body region; 83: source region; 84: contact region; 91: gate insulating film (insulating film); 92: gate electrode; 93: interlayer insulating film; 94: source electrode; 94a: contact electrode; 95: source interconnection layer; 96: metal region; 97: protective film; 98: drain electrode; BT1: first bottom portion; BT2: second bottom portion; CL: cell; IR: element region; IS: intersection; OR: termination region; ST: stepped portion; SW1: first side wall portion; SW2: second side wall portion; TR: trench.

The invention claimed is:

1. A silicon carbide semiconductor device comprising:
a silicon carbide layer having a first main surface and a second main surface opposite to said first main surface; and
a metal region,
said silicon carbide layer including
a drift region that constitutes said first main surface and that has a first conductivity type,
a body region that is provided on said drift region and that has a second conductivity type different from said first conductivity type, and
a source region that is provided on said body region to be separated from said drift region, that constitutes said second main surface, and that has the first conductivity type,
said silicon carbide layer being provided with a trench including a first side wall portion and a first bottom surface, said first side wall portion extending from said second main surface to said drift region through said source region and said body region, said first bottom surface being in said drift region, said silicon carbide layer including a second conductivity type region that is embedded in said drift region to face said first bottom surface and that has said second conductivity type, said second conductivity type region being separated from said body region, said second conductivity type region being electrically connected to said source region, said metal region being in contact with said source region, said source region and said second conductivity type region being electrically connected to each other via said metal region, said silicon carbide layer being provided with a stepped portion including a second bottom surface and a second side wall portion, said second bottom surface being between said first main surface and said second main surface, said second side wall portion connecting said second bottom surface and said second main surface to each other, said metal region being in contact with said source region in said second main surface and is in contact with said second bottom surface, said second conductivity type region being arranged in a plane, and said metal region being directly in contact with said second conductivity type region.

2. The silicon carbide semiconductor device according to claim 1, wherein said silicon carbide layer includes a termination region and an element region surrounded by said termination region, and said stepped portion is provided in said termination region.

3. The silicon carbide semiconductor device according to claim 2, wherein said termination region has a guard ring region having said second conductivity type, and said metal region is in contact with said guard ring region at said second bottom surface, and said guard ring region is in contact with said second conductivity type region.

4. The silicon carbide semiconductor device according to claim 3, wherein said termination region includes a field stop region that surrounds said guard ring region when viewed in a plan view and that has said first conductivity type, and said field stop region is spaced from said second main surface.

5. The silicon carbide semiconductor device according to claim 2, wherein said metal region is directly in contact with said second conductivity type region at said second bottom surface.

6. The silicon carbide semiconductor device according to claim 1, wherein said silicon carbide layer includes a termination region and an element region surrounded by said termination region, and said stepped portion is provided in said element region.

7. The silicon carbide semiconductor device according to claim 6, wherein said metal region is directly in contact with said second conductivity type region at said second bottom surface.

8. The silicon carbide semiconductor device according to claim 1, wherein said source region is in contact with said second conductivity type region via said body region and a JTE region having said second conductivity type.

9. The silicon carbide semiconductor device according to claim 1, wherein said first bottom surface of said trench surrounds said drift region when viewed in a plan view.

10. A silicon carbide semiconductor device comprising:

a silicon carbide layer having a first main surface and a second main surface opposite to said first main surface; and a metal region, said silicon carbide layer including a drift region that constitutes said first main surface and that has a first conductivity type, a body region that is provided on said drift region and that has a second conductivity type different from said first conductivity type, and a source region that is provided on said body region to be separated from said drift region, that constitutes said second main surface, and that has the first conductivity type, said silicon carbide layer being provided with a trench including a first side wall portion and a first bottom surface, said first side wall portion extending from said second main surface to said drift region through said source region and said body region, said first bottom surface being in said drift region, said silicon carbide layer including a second conductivity type region that is embedded in said drift region to face said first bottom surface and that has said second conductivity type, said second conductivity type region being separated from said body region, said second conductivity type region being electrically connected to said source region, said second conductivity type region being arranged in a plane, said metal region being directly in contact with said second conductivity type region, said silicon carbide layer is provided with a stepped portion including a second bottom surface and a second side wall portion, said second bottom surface being between said first main surface and said second main surface, said second side wall portion connecting said second bottom surface and said second main surface to each other, and said metal region is in contact with said source region in said second main surface and is in contact with said second bottom surface.

11. The silicon carbide semiconductor device according to claim 10, wherein said second conductivity type region has a mesh structure when viewed in a plan view.

12. The silicon carbide semiconductor device according to claim 11, wherein said source region and said second conductivity type region are electrically connected to each other via said metal region.

13. The silicon carbide semiconductor device according to claim 11, wherein said source region is in contact with said second conductivity type region via said body region and a JTE region having said second conductivity type.

14. The silicon carbide semiconductor device according to claim 13, wherein said first bottom surface of said trench extends to surround a polygonal cell when viewed in a plan view, and when viewed in a plan view, said second conductivity type region is provided at a location at which an apex of said cell overlaps with said second conductivity type region.

15. The silicon carbide semiconductor device according to claim 11, wherein
said first bottom surface of said trench surrounds said drift region when viewed in a plan view.

16. The silicon carbide semiconductor device according to claim 10, wherein
said first bottom surface of said trench surrounds said drift region when viewed in a plan view.

* * * * *